United States Patent
Chao et al.

(10) Patent No.: US 12,532,499 B2
(45) Date of Patent: Jan. 20, 2026

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Shih-Chieh Chao, Taichung (TW); Ryan Chia-Jen Chen, Hsinchu (TW); Yih-Ann Lin, Hsinchu (TW); Yu-Hsien Lin, Kaohsiung (TW); Li-Wei Yin, Hsinchu (TW); Tzu-Wen Pan, Hsinchu (TW); Jih-Sheng Yang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 391 days.

(21) Appl. No.: 18/192,146

(22) Filed: Mar. 29, 2023

(65) Prior Publication Data

US 2024/0332420 A1 Oct. 3, 2024

(51) Int. Cl.
| | |
|---|---|
| H10D 30/62 | (2025.01) |
| H10D 30/01 | (2025.01) |
| H10D 30/43 | (2025.01) |
| H10D 30/67 | (2025.01) |
| H10D 62/10 | (2025.01) |
| H10D 64/01 | (2025.01) |
| H10D 84/01 | (2025.01) |

(Continued)

(52) U.S. Cl.
CPC ....... *H10D 30/6211* (2025.01); *H10D 30/014* (2025.01); *H10D 30/024* (2025.01); *H10D 30/43* (2025.01); *H10D 30/6735* (2025.01); *H10D 30/6757* (2025.01); *H10D 62/121* (2025.01); *H10D 64/017* (2025.01); *H10D 84/0167* (2025.01); *H10D 84/038* (2025.01); *H10D 84/853* (2025.01)

(58) Field of Classification Search
CPC ............ H10D 84/0158; H10D 84/853; H10D 84/0135; H10D 30/024; H10D 30/6211; H01L 21/28088; H01L 21/823437
See application file for complete search history.

(56) References Cited

U.S. PATENT DOCUMENTS

| | | | | |
|---|---|---|---|---|
| 2016/0104644 A1* | 4/2016 | Liu | ...................... | H10D 84/038 |
| | | | | 257/401 |
| 2021/0210613 A1* | 7/2021 | Cho | ...................... | H10D 64/017 |
| 2021/0407819 A1* | 12/2021 | Wei | ...................... | H10D 84/038 |

* cited by examiner

*Primary Examiner* — Tuan A Hoang
(74) *Attorney, Agent, or Firm* — Ingrassia Fisher & Lorenz, LLP

(57) ABSTRACT

A method includes forming a gate stack for a short-channel device and a longer-channel device; forming a first metal cap layer over the gate stacks for the short-channel device and the longer-channel device, wherein the first metal cap layer of the longer-channel device has a metal-cap recess; forming a first dielectric cap layer in the metal-cap recess; selectively removing in parallel, a portion of the gate stacks and first metal cap layer for the short-channel device and the longer-channel device; forming a first channel recess between spacers in the short-channel device and a second channel recess between a spacer and the first dielectric cap layer in the longer-channel device by the selectively removing; wherein each of the first channel recess and the second channel recess has a width dimension and a difference between the width dimensions of the first channel recess and second channel recess is less than 3 nm.

20 Claims, 19 Drawing Sheets

(51) Int. Cl.
*H10D 84/03* (2025.01)
*H10D 84/85* (2025.01)

SEMICONDUCTOR DEVICE AND MANUFACTURING METHOD THEREOF

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum feature sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
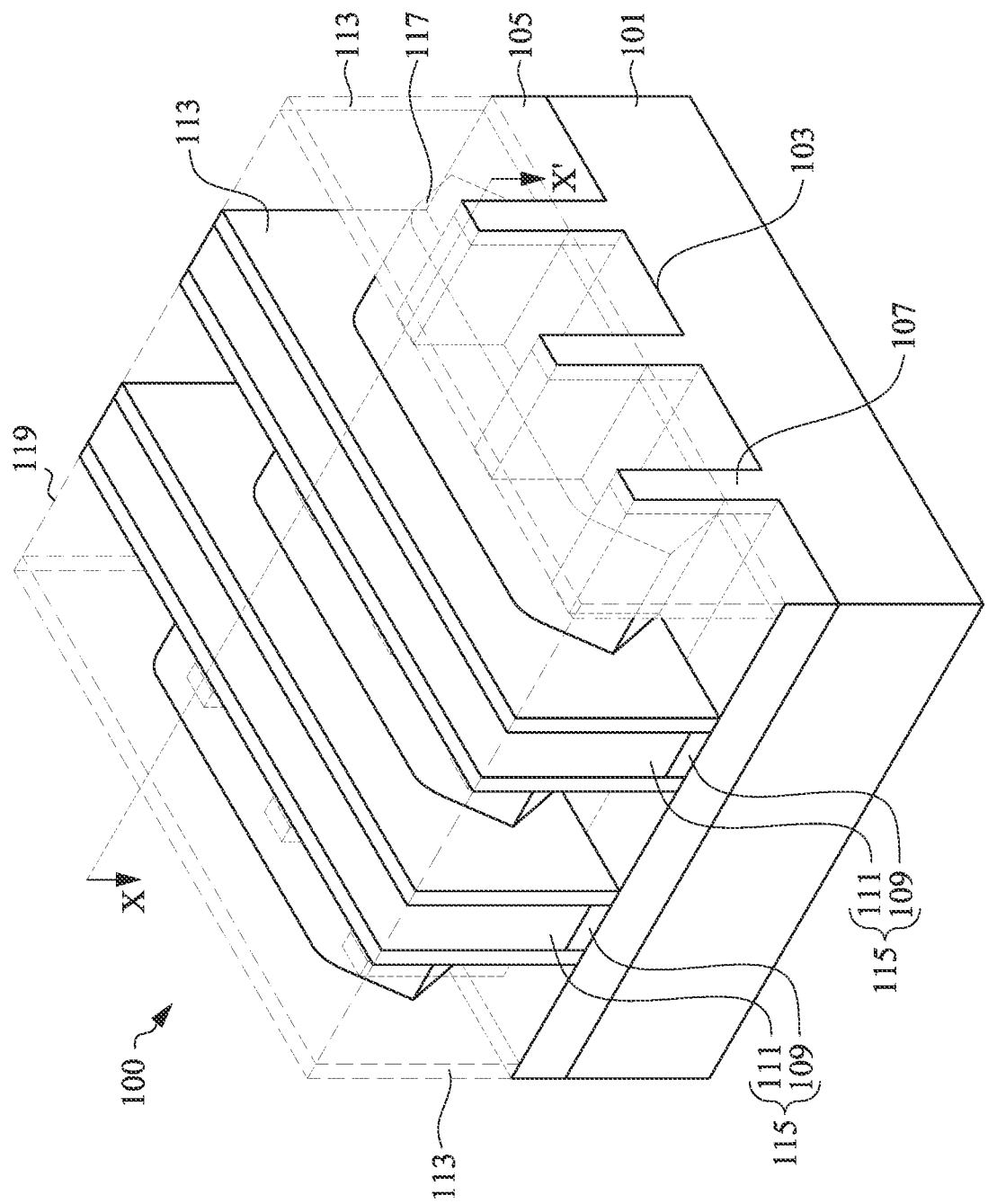
FIG. 1A a perspective view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Furthermore, spatially relative terms, such as "over", "overlying", "above", "upper", "top", "under", "underlying", "below", "lower", "bottom", and the like, may be used herein for ease of description to describe one element's or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present. When an element or layer is referred to as being "on" another element or layer, it is directly on and in contact with the other element or layer.

In addition, the present disclosure may repeat reference numerals and/or letters in the various examples. This repetition is for the purpose of simplicity and clarity and does not in itself dictate a relationship between the various embodiments and/or configurations discussed.

It is noted that references in the specification to "one embodiment," "an embodiment," "an example embodiment," "exemplary," "example," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to affect such feature, structure, or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Various embodiments are discussed herein in a particular context, namely, for forming a semiconductor structure that includes a fin-like field-effect transistor (FinFET) device. The semiconductor structure, for example, may be a complementary metal-oxide-semiconductor (CMOS) device including a P-type metal-oxide-semiconductor (PMOS) FinFET device and an N-type metal-oxide-semiconductor (NMOS) FinFET device. Embodiments will now be described with respect to particular examples including FinFET manufacturing processes. Embodiments, however, are not limited to the examples provided herein, and the ideas may be implemented in a wide array of embodiments. Thus, various embodiments may be applied to other semiconductor devices/processes, such as planar transistors, and the like. Further, some embodiments discussed herein are discussed in the context of devices formed using a gate-last process. In other embodiments, a gate-first process may be used.

While the figures illustrate various embodiments of a semiconductor device, additional features may be added in the semiconductor device depicted in the Figures and some of the features described below can be replaced, modified, or eliminated in other embodiments of the semiconductor device.

Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 1B:
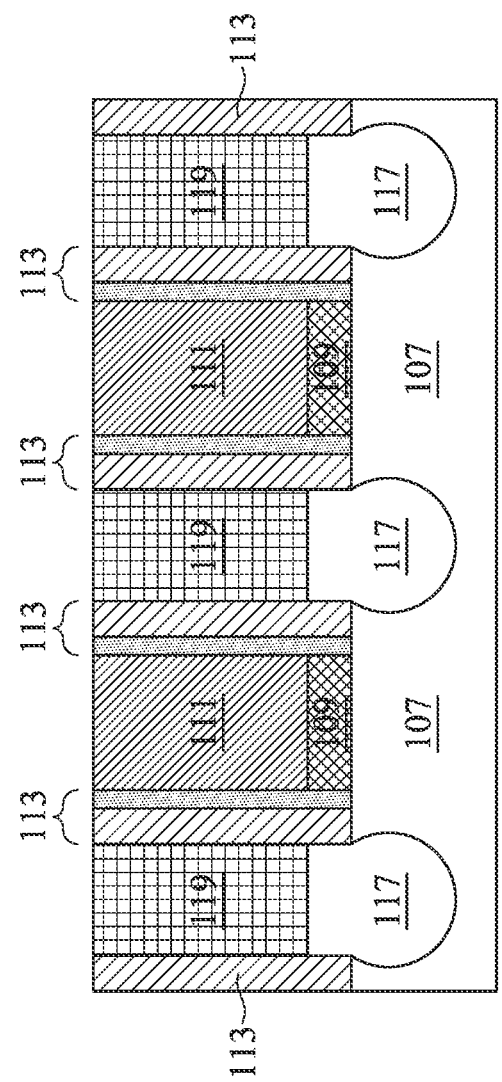
FIG. 1B illustrates a cross-sectional view of FIG. 1A along cutline X-X', in accordance with some embodiments.

With reference now to FIG. 1A, there is illustrated a perspective view of a semiconductor device 100 such as a FinFET device. FIG. 1B illustrates a cross-sectional view of FIG. 1A along cutline X-X', according to some embodiments. In an embodiment, the semiconductor device 100 comprises a substrate 101 and first trenches 103. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

In other embodiments the substrate 101 may be chosen to be a material which will specifically boost the performance (e.g., boost the carrier mobility) of the devices formed from the substrate 101. For example, in some embodiments the material of the substrate 101 may be chosen to be a layer of epitaxially grown semiconductor material, such as epitaxially grown silicon germanium which helps to boost some of the measurements of performance of devices formed from the epitaxially grown silicon germanium. However, while the use of these materials may be able to boost some of the performance characteristics of the devices, the use of these same materials may affect other performance characteristics of the device. For example, the use of epitaxially grown silicon germanium may degrade (with respect to silicon) the interfacial defects of the device.

The first trenches 103 may be formed as an initial step in the eventual formation of first isolation regions 105. The first trenches 103 may be formed using a masking layer (not separately illustrated in FIG. 1A) along with a suitable etching process. For example, the masking layer may be a hard mask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching processes additionally form fins 107 from those portions of the substrate 101 that remain unremoved. These fins 107 may be used to form the channel region of multiple-gate FinFET transistors. While FIG. 1A only illustrates three of the fins 107 formed from the substrate 101, any number of fins 107 may be utilized.

Furthermore, the fins 107 may be patterned by any suitable method. For example, the fins 107 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 107.

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as H2, and other methods, such as a reactive ion etch, a dry etch with etchants such as NH3/NF3, chemical oxide removal, or dry chemical clean may be used.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, dummy gate dielectrics 109, dummy gate electrodes 111 over the dummy gate dielectrics 109, and spacers 113 may be formed over each of the fins 107. In an embodiment the dummy gate dielectrics 109 may be formed by thermal oxidation, chemical vapor deposition, sputtering, or any other methods known and used in the art for forming a gate dielectric. Depending on the technique of gate dielectric formation, the dummy gate dielectrics 109 thickness on the top of the fins 107 may be different from the gate dielectric thickness on the sidewall of the fins 107.

The dummy gate dielectrics 109 may comprise a material such as silicon dioxide or silicon oxynitride. The dummy gate dielectrics 109 may be formed from a high permittivity (high-k) material (e.g., with a relative permittivity greater than about 5) such as lanthanum oxide (La2O3), aluminum oxide (Al2O3), hafnium oxide (HfO2), hafnium oxynitride (HfON), or zirconium oxide (ZrO2), or combinations thereof. Additionally, any combination of silicon dioxide, silicon oxynitride, and/or high-k materials may also be used for the dummy gate dielectrics 109.

The dummy gate electrodes 111 may comprise a conductive or non-conductive material and may be selected from a group comprising polysilicon, W, Al, Cu, AlCu, W, Ti, TiAlN, TaC, TaCN, TaSiN, Mn, Zr, TiN, Ta, TaN, Co, Ni, combinations of these, or the like. The dummy gate electrodes 111 may be deposited by chemical vapor deposition (CVD), sputter deposition, or other techniques known and used in the art for depositing conductive materials. The top surface of the dummy gate electrodes 111 may have a non-planar top surface, and may be planarized prior to patterning of the dummy gate electrodes 111 or gate etch. Ions may or may not be introduced into the dummy gate electrodes 111 at this point. Ions may be introduced, for example, by ion implantation techniques.

Once formed, the dummy gate dielectrics 109 and the dummy gate electrodes 111 may be patterned to form a series of dummy stacks 115 over the fins 107. The dummy stacks 115 define multiple channel regions located on each side of the fins 107 beneath the dummy gate dielectrics 109. The dummy stacks 115 may be formed by depositing and patterning a gate mask (not separately illustrated in FIG. 1A) on the dummy gate electrodes 111 using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride. The dummy gate electrodes 111 and the dummy gate dielectrics 109 may be etched using a dry etching process to form the patterned in the dummy stacks 115.

Once the dummy stacks 115 have been patterned, the spacers 113 may be formed. The spacers 113 may be formed on opposing sides of the dummy stacks 115. The spacers 113 may be formed by blanket depositing one (as illustrated in FIG. 1A for clarity) or more (as illustrated in FIG. 1B) spacer layers on the previously formed structure. The one or more spacer layers may comprise SiN, oxynitride, SiC, SiON, SiOCN, SiOC, oxide, and the like and may be formed by methods utilized to form such layers, such as chemical vapor deposition (CVD), plasma enhanced CVD, sputter, and other methods known in the art. In embodiments with more than one spacer layer, the one or more spacer layers may be formed in similar manners using similar materials, but different from one another, such as by comprising materials having different component percentages and with different curing temperatures and porosities. Furthermore, the one or more spacer layers may comprise a different material with different etch characteristics or the same material as the dielectric material within the first isolation regions 105. The one or more spacer layers may then be patterned, such as by one or more etches to remove the one or more spacer layers from the horizontal surfaces of the structure. As such, the one or more spacer layers are formed along sidewalls of the dummy stacks 115 and are collectively referred to as the spacers 113.

FIG. 1A further illustrates a removal of the fins 107 (although the location of the fins 107 is still illustrated in FIG. 1A to show where they were originally located) from those areas not protected by the dummy stacks 115 and the spacers 113 and a regrowth of source/drain regions 117. Source/drain region(s) may refer to a source or a drain, individually or collectively dependent upon the context. The removal of the fins 107 from those areas not protected by the dummy stacks 115 and the spacers 113 may be performed by a reactive ion etch (RIE) using the dummy stacks 115 and the spacers 113 as hard masks, or by any other suitable removal process. The removal may be continued until the fins 107 are either planar with (as illustrated) or below the surface of the first isolation regions 105.

Once these portions of the fins 107 have been removed, a hard mask (not separately illustrated), is placed and patterned to cover the dummy gate electrodes 111 to prevent growth and the source/drain regions 117 may be regrown in contact with each of the fins 107. In an embodiment the source/drain regions 117 may be regrown and, in some embodiments the source/drain regions 117 may be regrown to form a stressor that will impart a stress to the channel regions of the fins 107 located underneath the dummy stacks 115. In an embodiment wherein the fins 107 comprise silicon and the FinFET is a p-type device, the source/drain regions 117 may be regrown through a selective epitaxial process with a material, such as silicon or else a material such as silicon germanium that has a different lattice constant than the channel regions. The epitaxial growth process may use precursors such as silane, dichlorosilane, germane, and the like, and may continue for between about 5 minutes and about 120 minutes, such as about 30 minutes.

Once the source/drain regions 117 are formed, dopants may be implanted into the source/drain regions 117 by implanting appropriate dopants to complement the dopants in the fins 107. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the dummy stacks 115 and the spacers 113 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present embodiments to the steps presented above.

Additionally, at this point the hard mask that covered the dummy gate electrodes 111 during the formation of the source/drain regions 117 is removed. In an embodiment the hard mask may be removed using, e.g., a wet or dry etching process that is selective to the material of the hard mask. However, any suitable removal process may be utilized.

FIG. 1A also illustrates a formation of a first interlayer dielectric (ILD) layer 119 (illustrated in dashed lines in FIG. 1A in order to illustrate more clearly the underlying structures) over the dummy stacks 115 and the source/drain regions 117. The first ILD layer 119 may comprise a material such as boron phosphorous silicate glass (BPSG), although any suitable dielectrics may be used. The first ILD layer 119 may be formed using a process such as PECVD, although other processes, such as LPCVD, may alternatively be used. Once formed, the first ILD layer 119 may be planarized with the spacers 113 using, e.g., a planarization process such as chemical mechanical polishing process, although any suitable process may be utilized.

Figure 2:
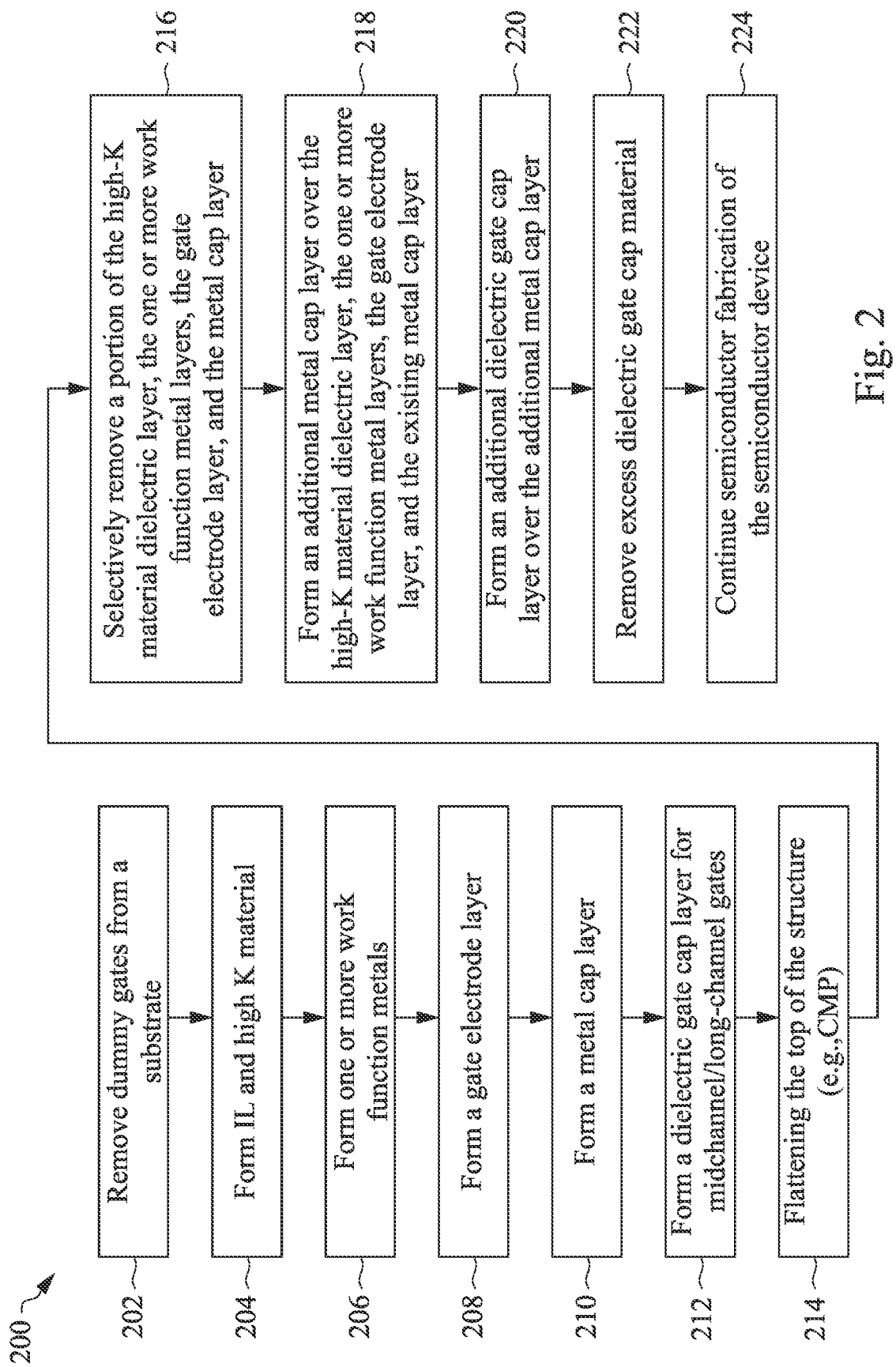
FIG. 2 is a process flow chart depicting an example fabrication process for forming, in a semiconductor device, metal gates that include a gate stack, a metal cap disposed above the gate stack, and a dielectric layer (such as silicon nitride (SiN)) disposed above the metal cap, in accordance with some embodiments.

FIG. 2 is a process flow chart depicting an example process 200 for forming, in a semiconductor device, metal gates that include a gate stack, a metal cap disposed above the gate stack, and a dielectric layer (such as silicon nitride (SiN)) disposed above the metal cap. The example process 200 may be applied to a semiconductor device having short-channel gates (e.g., gates having a channel length between 15 to 25 nanometers), mid-channel gates (e.g., gates having a channel length between 30 to 60 nanometers), and/or long-channel gates (e.g., gates having a channel length between 80 to 200 nanometers).

FIG. 2 is described in conjunction with FIGS. 3A-3K, which are cross-sectional views of a semiconductor device, which illustrate the semiconductor device at various stages of fabrication in accordance with some embodiments of the present disclosure of the example process 200. The process 200 is merely an example, and is not intended to limit the present disclosure beyond what is explicitly recited in the claims. Additional steps may be provided before, during, and after example process 200, and some of the steps described can be moved, replaced, or eliminated for additional embodiments of example process 200. Additional features may be added in the semiconductor device depicted in the figures and some of the features described below can be replaced, modified, or eliminated in other embodiments of the semiconductor device.

It is understood that parts of the semiconductor device may be fabricated by typical semiconductor technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, and/or other logic devices, etc., but is simplified for a better understanding of concepts of the present disclosure. In some embodiments, the exemplary devices include a plurality of semiconductor devices (e.g., transistors), including PFETs, NFETs, etc., which may be interconnected. Moreover, it is noted that the operations of process 200, including any descriptions given with reference to the Figures are merely exemplary and are not intended to be limiting beyond what is specifically recited in the claims that follow.

FIGS. 3A-3K are diagrams depicting enlarged views of an example area 300 (and of sub-area 301 of example area 300) at various stages of fabricating a semiconductor device, in accordance with some embodiments. In some figures, some reference numbers of components or features illustrated therein may be omitted to avoid obscuring other components or features; this is for case of depicting the figures.

At block 202, the example process 200 includes removing dummy gates from a substrate. The dummy gate electrode and/or gate dielectric may be removed by suitable etching processes. Referring to the example of FIGS. 3A and 3B, in an embodiment of block 202, the example area 300 and sub-area 301 include a substrate 302 with openings 304 formed by the removal of dummy gates. In some embodiments, the substrate 302 may be a semiconductor substrate such as a silicon substrate. The substrate 302 may include various layers, including conductive or insulating layers formed on a semiconductor substrate. The substrate 302 may include various doping configurations depending on design requirements as is known in the art. For example, different doping profiles (e.g., n wells, p wells) may be formed on the substrate 302 in regions designed for different device types (e.g., n-type field effect transistors (NFET), p-type field effect transistors (PFET)). The suitable doping may include ion implantation of dopants and/or diffusion processes. The substrate 302 typically has isolation features (e.g., shallow trench isolation (STI) features) interposing the regions providing different device types. The substrate 302 may also include other semiconductors such as germanium, silicon carbide (SiC), silicon germanium (SiGe), or diamond. Alternatively, the substrate 302 may include a compound semiconductor and/or an alloy semiconductor. Further, the substrate 302 may optionally include an epitaxial layer (epi-layer), may be strained for performance enhancement, may include a silicon-on-insulator (SOI) structure, and/or have other suitable enhancement features.

The sub-area 301 further includes one or more spacer layers 306. In this example the one or more spacer layers 306 include a first spacer layer 306a (such as an etch stop layer), a second spacer layer 306b, and a third spacer layer 306c. The one or more spacer layers may comprise SiO2, SiN, SiOC, oxynitride, SiC, SiON, SiOCN, oxide, and the like and may be formed by methods utilized to form such layers, such as chemical vapor deposition (CVD), plasma enhanced CVD, sputter, and other methods known in the art.

The sub-area 301 further includes an interlayer dielectric (ILDO) layer 308 over source/drain regions 310 and a second dielectric layer 312 above the ILDO layer 308. The ILDO layer 308 may comprise an oxide or a material such as boron phosphorous silicate glass (BPSG), although any suitable dielectrics may be used. The second dielectric layer 312 may comprise a material such as SiN or SiOCN, although any suitable dielectrics may be used. The ILDO layer 308 and/or the second dielectric layer 312 may be formed using a process such as PECVD, although other processes, such as LPCVD, may alternatively be used.

At block 204, the example process 200 includes forming an interfacial layer (IL) in the opening 304 over the substrate 302 and a high-K material dielectric layer over the IL. The interfacial layer may be formed by chemical oxidation, thermal oxidation, atomic layer deposition (ALD), chemical vapor deposition (CVD), and/or other suitable method. The high-K gate dielectric layer may be formed by ALD, physical vapor deposition (PVD), CVD, oxidation, and/or other suitable methods.

At block 206, the example process 200 includes forming one or more work function metal layers. The one or more work function metal layers may be formed by CVD, ALD and/or other suitable processes.

Figure 3B:
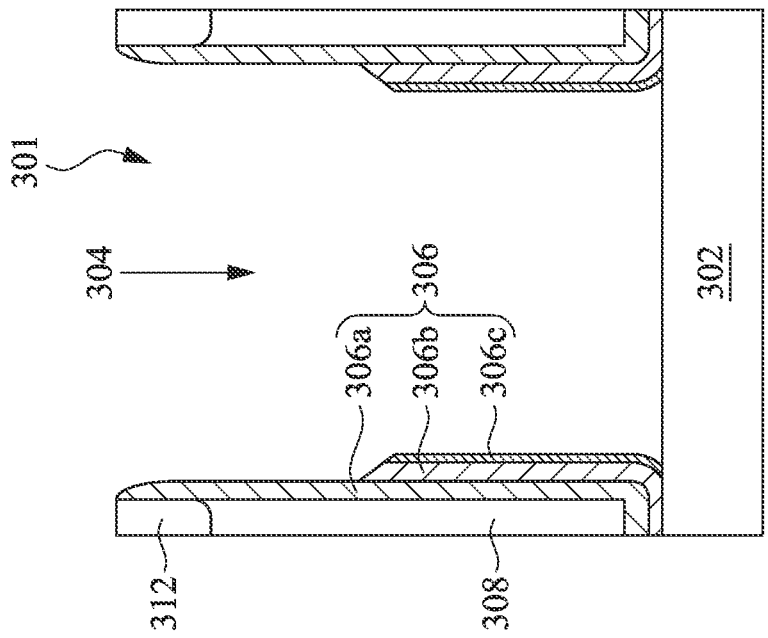
FIGS. 3A-3Q are diagrams depicting enlarged views of an example area at various stages of fabricating a semiconductor device, in accordance with some embodiments.
Figure 3A:
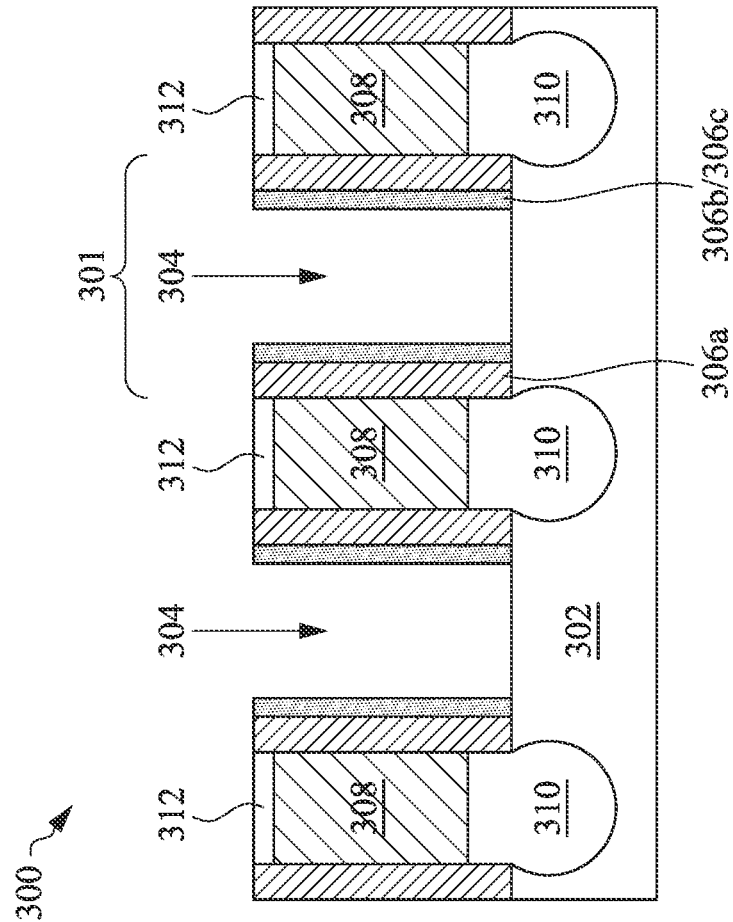
Figure 3D:
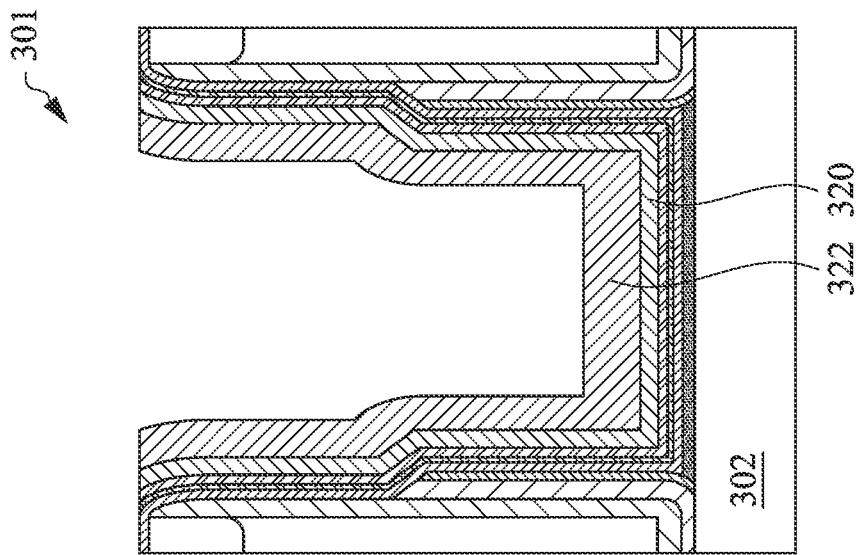
Figure 3C:
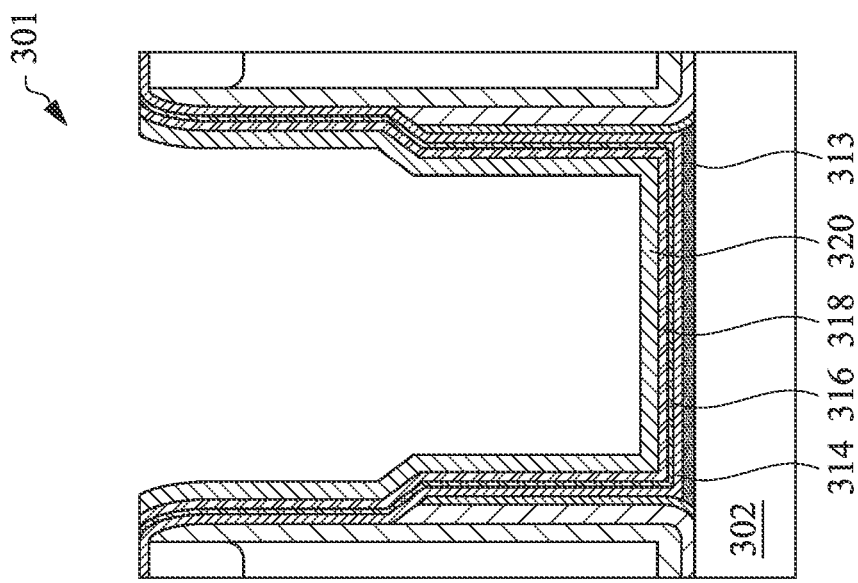

Referring to the example of FIG. 3C, in an embodiment of blocks 204 and 206, the example sub-area 301 includes a high-K material dielectric layer 314 deposited over an IL 313, a first work function metal layer 316 deposited over the high-K material dielectric layer 314, a second work function metal layer 318 deposited over the first work function metal layer 316, and a third work function metal layer 320 deposited over the second work function metal layer 318.

In some embodiments, the interfacial layer may include a dielectric material such as silicon oxide (SiO2), HfSiO, or silicon oxynitride (SiON). The interfacial layer may be formed by chemical oxidation, thermal oxidation, atomic layer deposition (ALD), chemical vapor deposition (CVD), and/or other suitable method.

High-K gate dielectrics, as used and described herein, include dielectric materials having a high dielectric constant, for example, greater than that of thermal silicon oxide (3.9). The high-K material dielectric layer 314 may include a high-K dielectric layer such as hafnium oxide (HfO2). Alternatively, the High-K gate dielectric layer may include other high-K dielectrics, such as TiO2, HfZrO, Ta2O3, HfSiO4, ZrO2, ZrSiO2, LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, oxynitrides (SiON), combinations thereof, or other suitable material. The high-K material dielectric layer 314 may be formed by ALD, physical vapor deposition (PVD), CVD, oxidation, and/or other suitable methods.

In some embodiments, the first work function metal layer 316 and the second work function metal layer 318 may comprise p-type work function metals used for tuning the threshold voltage for p-type transistors. In some embodiments, the third work function metal layer 320 may comprise an n-type work function metal used for tuning the threshold voltage for n-type transistors. The first work function metal layer 316 and the second work function metal layer 318 may include a transition metal, such as TiN, TaN, WCN, or any suitable materials or a combination thereof. The third work function metal layer 320 may include a transition metal, such as TiAlC, TaAlC, or any suitable materials or a combination thereof.

At block 208, the example process 200 includes forming a gate electrode layer. The gate electrode layer may be formed by CVD, ALD and/or other suitable processes. Referring to the example of FIG. 3D, in an embodiment of block 208, the example sub-area 301 includes a gate electrode layer 322 deposited over the third work function metal layer 320. The gate electrode layer 322 may comprise a material such as TiN or any suitable materials or a combination thereof.

At block 210, the example process 200 includes forming a first metal cap layer over the gate electrode layer. For mid-channel and long-channel gates, the first metal cap layer does not completely fill the opening 304 and has a metal-cap recess 327. This allows room in the opening 304 for forming a dielectric gate cap layer in subsequent operations. The first metal cap layer may be formed by CVD, ALD and/or other suitable processes.

Figure 3F:
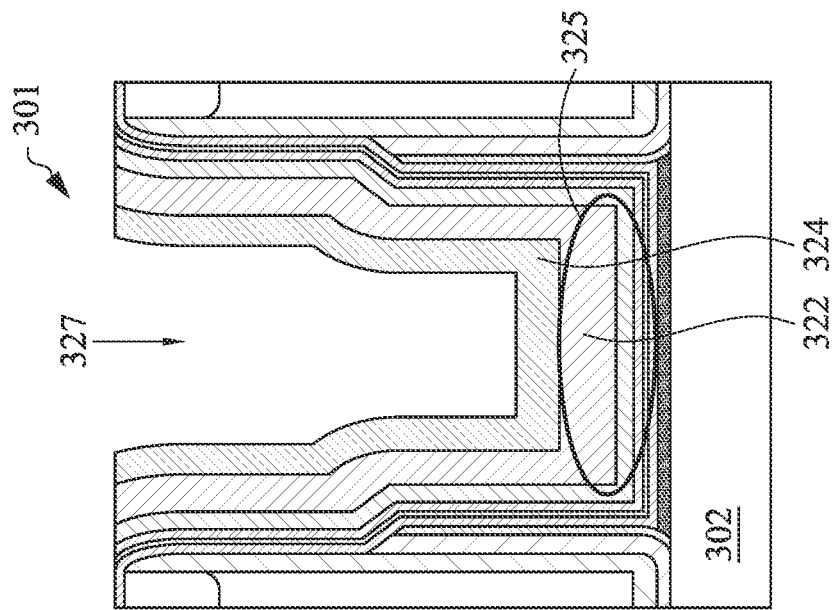
Figure 3E:
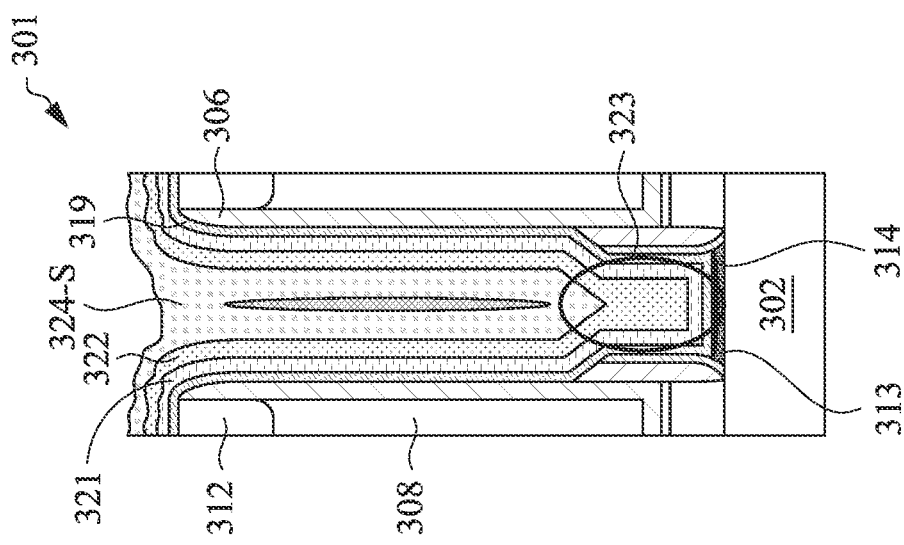

Referring to the example of FIG. 3E, in an embodiment of block 210 for a short-channel gate, the example sub-area 301 includes a first metal cap layer 324-S deposited over a gate stack 323 (e.g., the gate electrode layer 322, work function metal layers 321/319, high-K material dielectric layer 314, IL 313). The first metal cap layer 324-S may comprise a metal such as Tungsten (W) or any suitable materials or a combination thereof.

Referring to the example of FIG. 3F, in an embodiment of block 210 for mid-channel and long-channel gates, the example sub-area 301 includes a first metal cap layer 324 with a metal-cap recess 327 deposited over a gate stack 325 (e.g., the gate electrode layer 322, work function metal layers 320/318/316, high-K material dielectric layer 314, IL 313). The first metal cap layer 324 may comprise a metal such as Tungsten (W) or any suitable materials or a combination thereof.

At block 212, the example process 200 includes, for mid-channel and long-channel gates, forming a dielectric gate cap layer. The dielectric gate cap layer may be formed by depositing dielectric material via a deposition process such as CVD, ALD and/or other suitable processes. Inclusion of the dielectric gate cap layer can enhance process yield. At block 214 for short-channel gates, mid-channel gates, and long-channel gates, the example process 200 includes planarizing the top of the gate region, for example, using chemical mechanical polishing (CMP) operations.

Figure 3H:
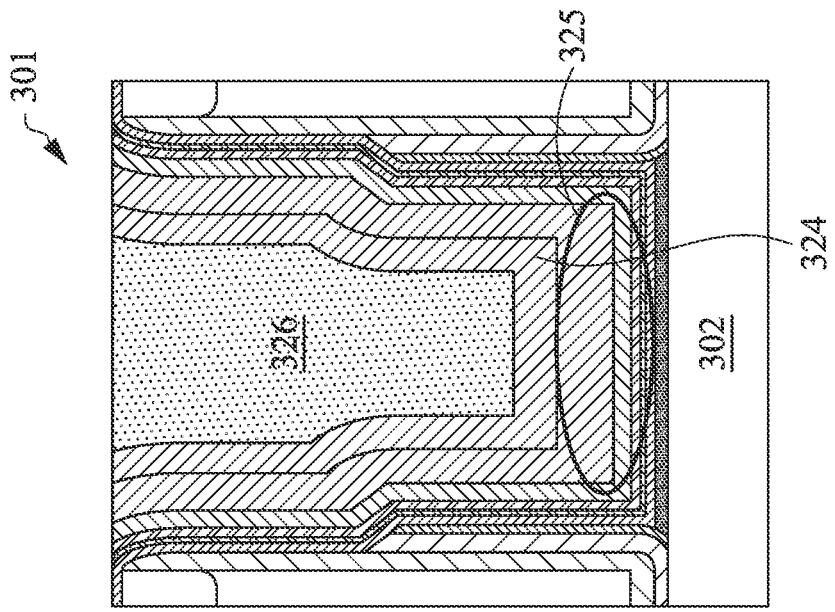
Figure 3G:
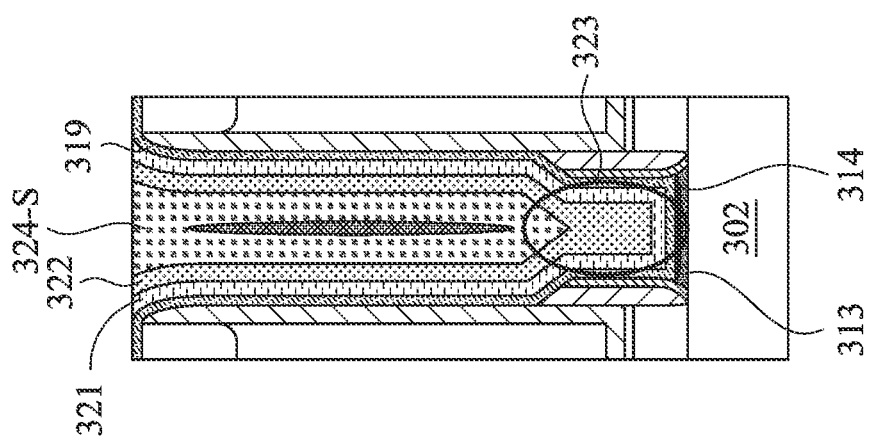

Referring to the example of FIG. 3G, in an embodiment of block 214 for short-channel gates, the example sub-area 301 includes the first metal cap layer 324-S deposited over the gate stack 323 (e.g., the gate electrode layer 322, work function metal layers 321/319, high-K material dielectric layer 314, IL 313). The top of the example sub-area 301 has been smoothed via the CMP operations. The work function metal layer 319 in this example is a p-channel work function metal layer, and the work function metal layer 321 is an n-channel work function metal layer.

Referring to the example of FIG. 3H, in an embodiment of blocks 212 and 214 for mid-channel and long-channel gates, the example sub-area 301 includes a first dielectric gate cap layer 326 with a smoothed top deposited over the first metal cap layer 324 and gate stack 325 (e.g., the gate electrode layer 322, work function metal layers 320/318/316, high-K material dielectric layer 314, IL 313). The first dielectric gate cap layer 326 may comprise a material such as silicon nitride (SiN), an oxide, or any suitable materials or a combination thereof.

At block 216, the example process 200 includes metal gate etch back operations wherein a portion of the high-K material dielectric layer, the work function metal layers, the gate electrode layer, and the first metal cap layer are selectively removed to a level above a bottom surface of the first metal cap layer and below a top surface of a body portion of the first metal cap layer during metal gate etch back operations. For the mid-channel and long-channel gates, the work function metal layers, the gate electrode layer, and the first metal cap layer are selectively removed to cause a portion of the first metal cap layer to remain on sidewalls of the dielectric gate cap layer. The metal gate etch back operations are controlled to form a recess above the metal gate.

Referring to the example of FIG. 3I, in an embodiment of block 216 for short-channel gates, a portion of the high-K material dielectric layer, the work function metal layers, the gate electrode layer 322, and the first metal cap layer 324 have been selectively removed to a level above a bottom surface (324a) of the first metal cap layer 324 and below a top surface (324b) of the first metal cap layer 324. The metal etch back operations form a recess 328 having a critical dimension 329 across first spacer layers 306a of a short-channel gate.

Figure 3J:
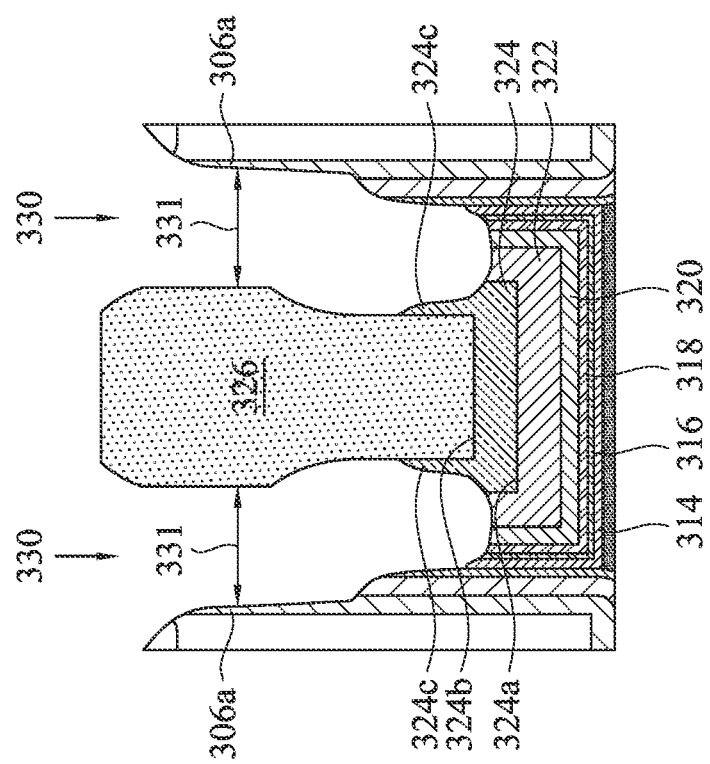
Figure 3I:
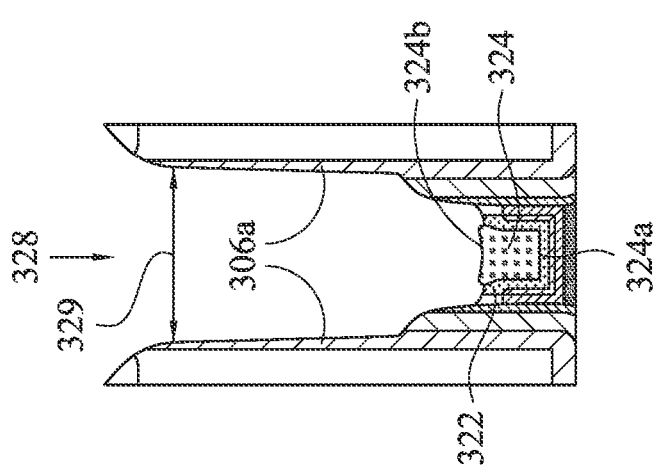

Referring to the example of FIG. 3J, in an embodiment of block 216 for mid-channel and long-channel gates, a portion of the high-K material dielectric layer 314, the one or more work function metal layers (e.g., first work function metal layer 316, the second work function metal layer 318, and the third work function metal layer 320), the gate electrode layer 322, and the first metal cap layer 324 have been selectively removed to a level above a bottom surface (324a) of the first metal cap layer 324 and below a top surface (324b) of a body portion of the first metal cap layer 324. The high-K material dielectric layer 314, the one or more work function metal layers, the gate electrode layer 322, and the first metal cap layer 324 have been selectively removed during metal gate etch back operations to cause sidewall portions 324c of the first metal cap layer 324 to remain on sidewalls of the dielectric gate cap layer 326. These sidewall portions 324c of the first metal cap layer 324 can prevent defects from forming during further processing of the semiconductor structure, such as the dielectric gate cap layer 326 being dislodged or moving to an undesired location during further processing of the semiconductor structure.

The metal etch back operations selectively remove a portion of the high-K material dielectric layer 314, the one or more work function metal layers (e.g., first work function metal layer 316, the second work function metal layer 318, and the third work function metal layer 320), the gate electrode layer 322, and the first metal cap layer 324 and cause a recess 330 to form across first spacer layers 306a of a mid-channel or long-channel gate having a critical dimension 331 that is comparable in size to the critical dimension 329 of the recess 328 in a short-channel gate. The high-K material dielectric layer 314, the one or more work function metal layers (e.g., first work function metal layer 316, the second work function metal layer 318, and the third work function metal layer 320), the gate electrode layer 322, and the first metal cap layer 324 may be selectively removed during metal gate etch back operations using dry etch operations.

In various embodiments, the dry etching operations may be performed in a plasma dry etch chamber. In various embodiments, during dry etch operations, the etching is accomplished using a gas source comprising an etch gas, such as $BCl_3$, $Cl_2$, Ar, and $O_2$. In various embodiments, the $BCl_3$ is administered between about 0 sccm (standard cubic centimeters per minute) to about 1000 sccm, the $Cl_2$ is administered between about 0 sccm to about 1000 sccm, the Ar is administered between about 0 sccm to about 500 sccm, and the $O_2$ is administered between about 0 sccm to about 100 sccm. In various embodiments, the etch gas is administered with a chamber pressure from about 1.5 mTorr to about 300 mTorr, at a source power from about 300 W to about 1000 W, and at a bias power from about 0 W to about 100 W.

At block 218, the example process 200 includes forming a second metal cap layer over the high-K material dielectric layer, the one or more work function metal layers, the gate electrode layer, and the first metal cap layer. The second metal cap layer may be formed by CVD, ALD and/or other suitable processes. The second metal cap layer may be added to form a combined metal cap that stretches between the one or more spacers and across the top of the high-K material dielectric layer, the one or more work function metal layers, the gate electrode layer, and the first metal cap layer.

Figure 3L:
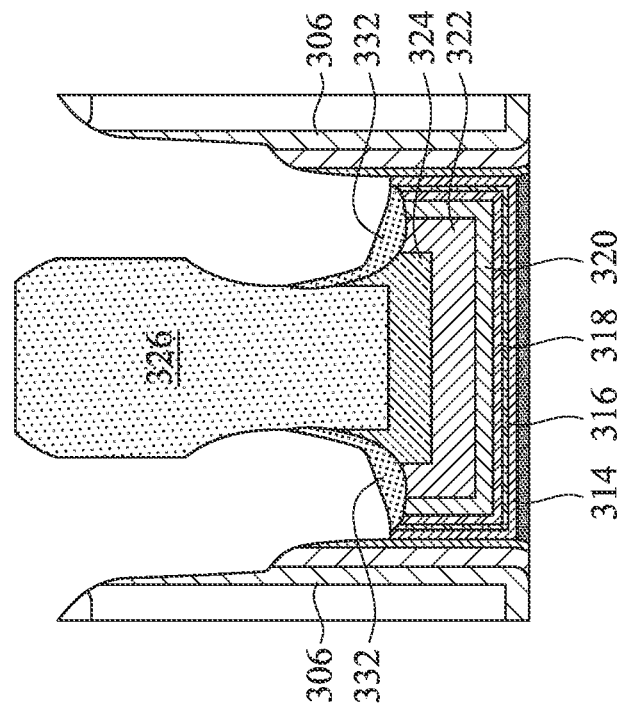
Figure 3K:
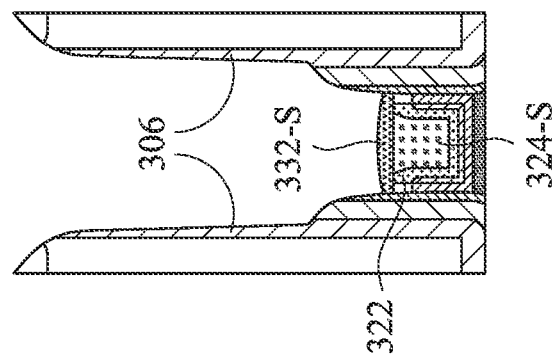

Referring to the example of FIG. 3K, in an embodiment of block 218 for a short-channel gate, a second metal cap layer 332-S had been formed over the high-K material dielectric layer, the one or more work function metal layers, the gate electrode layer 322, and the first metal cap layer 324-S. The second metal cap layer 332-S may comprise a metal such as Tungsten (W) or any suitable materials or a combination thereof. The second metal cap layer 332-S forms a combined metal cap that stretches between the one or more spacer layers 306 and across the top of the high-K material dielectric layer, the one or more work function metal layers, the gate electrode layer 322, and the first metal cap layer 324-S.

Referring to the example of FIG. 3L, in an embodiment of block 218 for a mid-channel or long-channel gate, a second metal cap layer 332 had been formed over the high-K material dielectric layer 314, the one or more work function metal layers (e.g., first work function metal layer 316, the second work function metal layer 318, and the third work function metal layer 320), the gate electrode layer 322, and the first metal cap layer 324. The second metal cap layer 332 may comprise a metal such as Tungsten (W) or any suitable materials or a combination thereof. The second metal cap layer 332 forms a combined metal cap that stretches between the one or more spacer layers 306 and across the top of the high-K material dielectric layer 314, the one or more work function metal layers (e.g., first work function metal layer 316, the second work function metal layer 318, and the third work function metal layer 320), the gate electrode layer 322, and the first metal cap layer 324.

At block 220, the example process 200 includes forming an additional dielectric gate cap layer over the second metal cap layer. The additional dielectric gate cap layer may be deposited by CVD, ALD and/or other suitable processes.

At block 222, the example process 200 includes removing excess dielectric gate cap material. This may be performed using planarization operations such as chemical mechanical (CMP) operations.

Figure 3N:
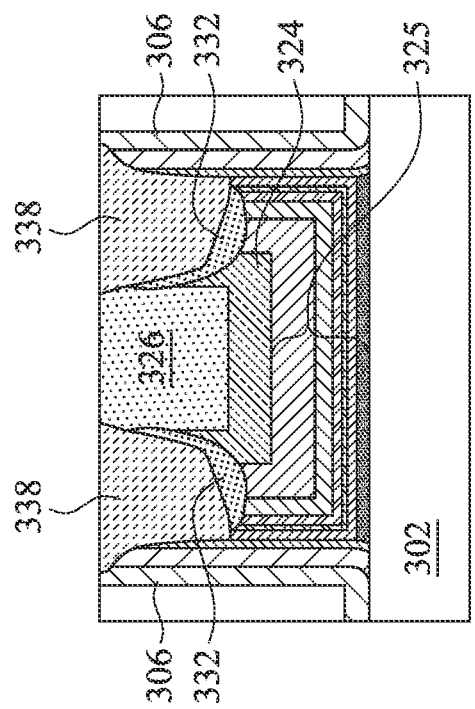
Figure 3M:
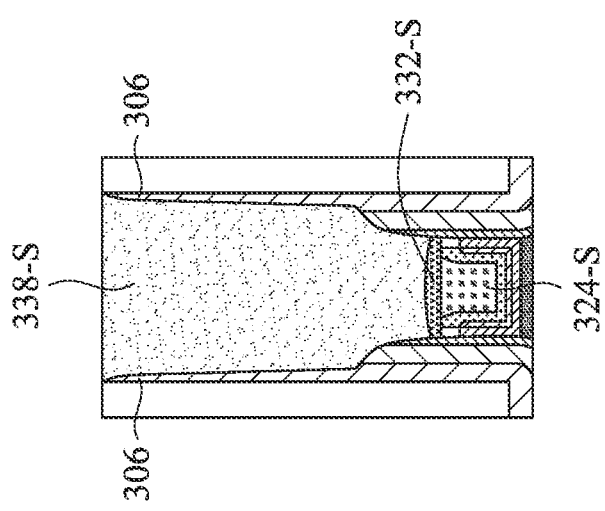

Referring to the example of FIG. 3M in an embodiment of blocks 220 and 222 for short-channel gates, dielectric gate cap layer 338-S has been formed over the second metal cap layer 332-S. The dielectric gate cap layer 338-S may comprise a material such as silicon nitride (SiN), an oxide, or any suitable materials or a combination thereof. The dielectric gate cap layer 338-S stretches between the one or more spacer layers 306 and across the top of the second metal cap layer 332-S. One stage of fabrication is depicted with a gate stack (e.g., high-K material dielectric layer 314, p-channel work function metal layer 319, n-channel work function metal layer 321, and gate electrode layer 322), a combined metal cap (e.g., first metal cap layer 324-S and second metal cap layer 332-S), and a dielectric gate cap layer 338-S disposed over an active region of a substrate 302. The dielectric gate cap layer 338-S and spacer layers 306 have been planarized to a desired height.

Referring to the example of FIG. 3N in an embodiment of blocks 220 and 222 for mid-channel and long-channel gates, additional dielectric gate cap layer 338 has been formed over the second metal cap layer 332. The additional dielectric gate cap layer 338 may comprise a material such as silicon nitride (SiN), an oxide, or any suitable materials or a combination thereof. The additional dielectric gate cap layer 338 along with the first dielectric gate cap layer 326 forms a combined dielectric gate cap that stretches between the one or more spacer layers 306 and across the top of the second metal cap layer 332. One stage of fabrication is depicted with a gate stack (e.g., high-K material dielectric layer 314, first work function metal layer 316, second work function metal layer 318, third work function metal layer 320, and gate electrode layer 322), a combined metal cap (e.g., first metal cap layer 324 and second metal cap layer 332), and a combined dielectric gate cap (e.g., first dielectric gate cap layer 326 and additional dielectric gate cap layer 338) disposed over an active region of a substrate 302. The dielectric gate cap layers 326/338 and spacer layers 306 have been planarized to a desired height.

With the wider channel length of mid-channel gates and long-channel gates, more metal is exposed in plasma during dry etching operations during metal gate etch back operations which can result in a smaller recess being etched. The use of the dielectric gate cap layer 326 for mid-channel gates and long-channel gates allows the performance of example process 200 to result in the CD of long-channel gates comparable to the CD of short-channel gates, and the CD of mid-channel gates comparable to the CD of short-channel gates. This provides for improved recess loading for metal gate etch back operations due to high selectivity between SiN and work function metal. The use of the dielectric gate cap layer 326 for mid-channel gates and long-channel gates allows the performance of example process 200 to result in a larger process window for CMP control, better defect window, and improved yield.

Figure 3P:
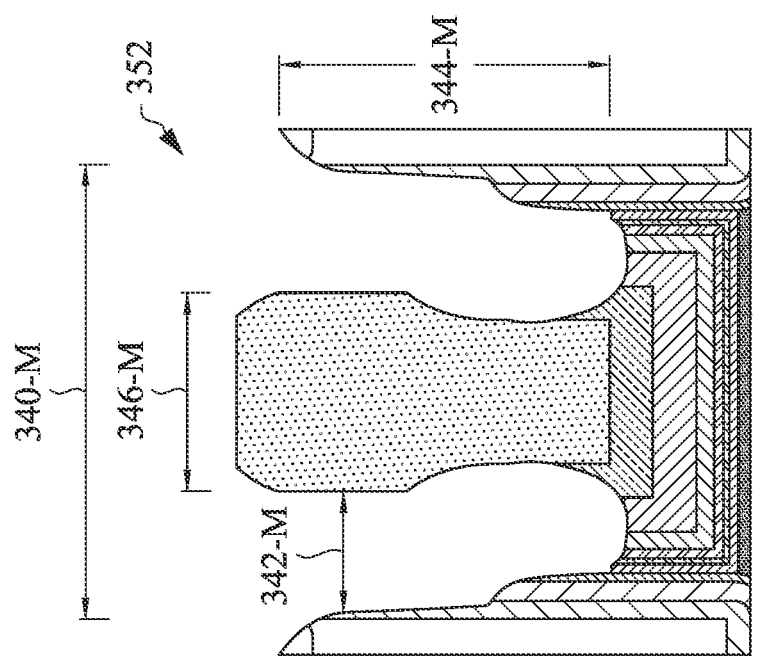
Figure 3O:
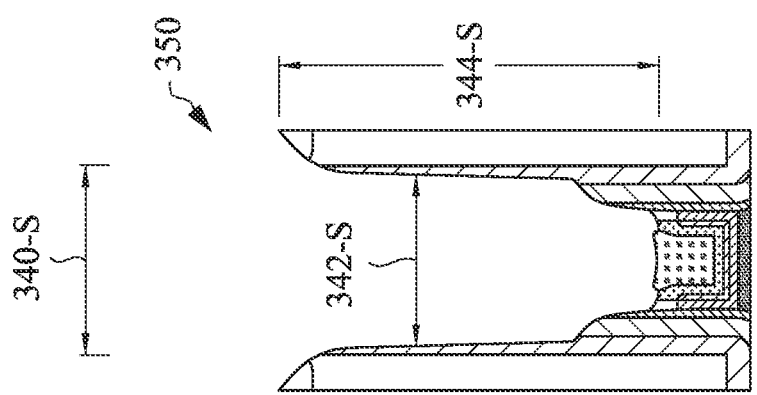
Figure 3Q:
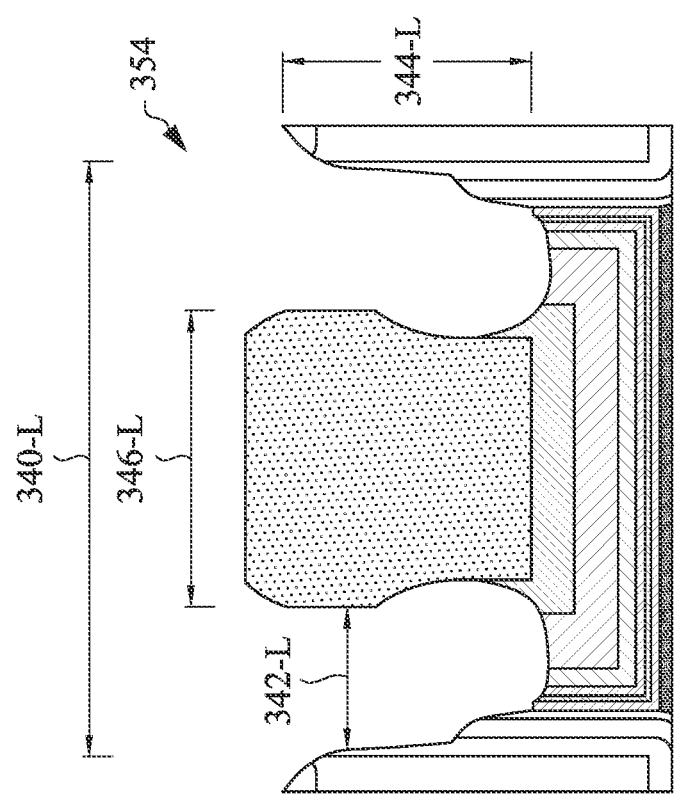

FIG. 3O illustrates a cross sectional view at one stage of fabrication for a short-channel gate 350, in accordance with some embodiments. FIG. 3P illustrates a cross sectional view at the same stage of fabrication for a mid-channel gate 352, in accordance with some embodiments. FIG. 3Q illustrates a cross sectional view at the same stage of fabrication for a long-channel gate 354, in accordance with some embodiments. Performance of the example process 200 results in a short-channel gate 350 fabricated with a gate length (LG) 340-S, a critical dimension (CD) 342-S, and a recess depth 344-S, as illustrated in FIG. 3O; a mid-channel gate 352 fabricated with a LG 340-M, a CD 342-M, and a recess depth 344-M, as illustrated in FIG. 3P; and a long-channel gate 354 is fabricated with a LG 340-L, a CD 342-L, and a recess depth 344-L, as illustrated in FIG. 3Q.

In this example, the short-channel gate length 340-S is approximately 15 nm to approximately 25 nm, the mid-channel gate length 340-M is approximately 30 nm to approximately 60 nm, and the long-channel gate length 340-L is approximately 80 nm to approximately 200 nm. In this example, the short-channel gate is fabricated without a dielectric gate cap, the mid-channel gate is fabricated with a dielectric gate cap width 346-M of approximately 15 nm to approximately 30 nm, and the large-channel gate is fabricated with a dielectric gate cap width 346-L of approximately 40 nm to approximately 180 nm.

In various embodiments, performance of the example process 200 results in the CD of a mid-channel gate 352 and a long-channel gate 354 to be comparable in size to the CD of a short-channel gate 350. In an example, the short-channel gate CD (342-S) is approximately 10 nm to approximately 15 nm, the mid-channel gate CD (342-M) is approximately 7 nm to approximately 18 nm, and the long-channel gate CD (342-L) is approximately 7 nm to approximately 18 nm. In this example, the delta between the short-channel gate CD (342-S) and the mid-channel gate CD (342-M) is less than 3 nm; and the delta between the short-channel gate CD (342-S) and the long-channel gate CD (342-L) is less than 3 nm.

In various embodiments, performance of the example process 200 results in the recess depth of a mid-channel gate 352 and a long-channel gate 354 to be comparable in size to the recess depth of a short-channel gate 350. In an example, the short-channel gate recess depth (344-S) is approximately 30 nm to approximately 70 nm, the mid-channel gate depth (344-M) is approximately 25 nm to approximately 75 nm, and the long-channel gate depth (344-L) is approximately 25 nm to approximately 75 nm. In this example, the delta between the short-channel gate recess depth (344-S) and the mid-channel gate recess depth (344-M) is ± approximately 2 nm to approximately 5 nm; and the delta between the short-channel gate recess depth (344-S) and the long-channel gate recess depth (344-L) is ± approximately 2 nm to approximately 5 nm. In this example, the ratio of the difference between the short-channel gate recess depth (344-S) and the mid-channel gate recess depth (344-M) is within a range of approximately 30/75=0.4 to approximately 70/25=2.8.

In another example, the short-channel gate recess depth (344-S) is approximately 40 nm to approximately 60 nm, the mid-channel gate depth (344-M) is approximately 35 nm to approximately 55 nm, and the long-channel gate depth (344-L) is approximately 35 nm to approximately 55 nm. In this example, the delta between the short-channel gate recess depth (344-S) and the mid-channel gate recess depth (344-M) is ± approximately 2 nm to approximately 5 nm; and the delta between the short-channel gate recess depth (344-S) and the long-channel gate recess depth (344-L) is ± approximately 2 nm to approximately 5 nm. In this example, the ratio of the difference between the short-channel gate recess depth (344-S) and the mid-channel gate recess depth (344-M) is within a range of approximately 40/55=0.73 to approximately 60/35=1.71.

At block 224, the example process 200 includes continuing semiconductor fabrication of the semiconductor device. Also, additional fabrication operations not described in process 200 can occur before, between, and after the blocks 202-222 included in process 200.

A semiconductor device may undergo further processing to form various features and regions known in the art. For example, subsequent processing may form contact openings, contact metal, as well as various contacts/vias/lines and multilayer interconnect features (e.g., metal layers and interlayer dielectrics) on the substrate, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

Figure 4:
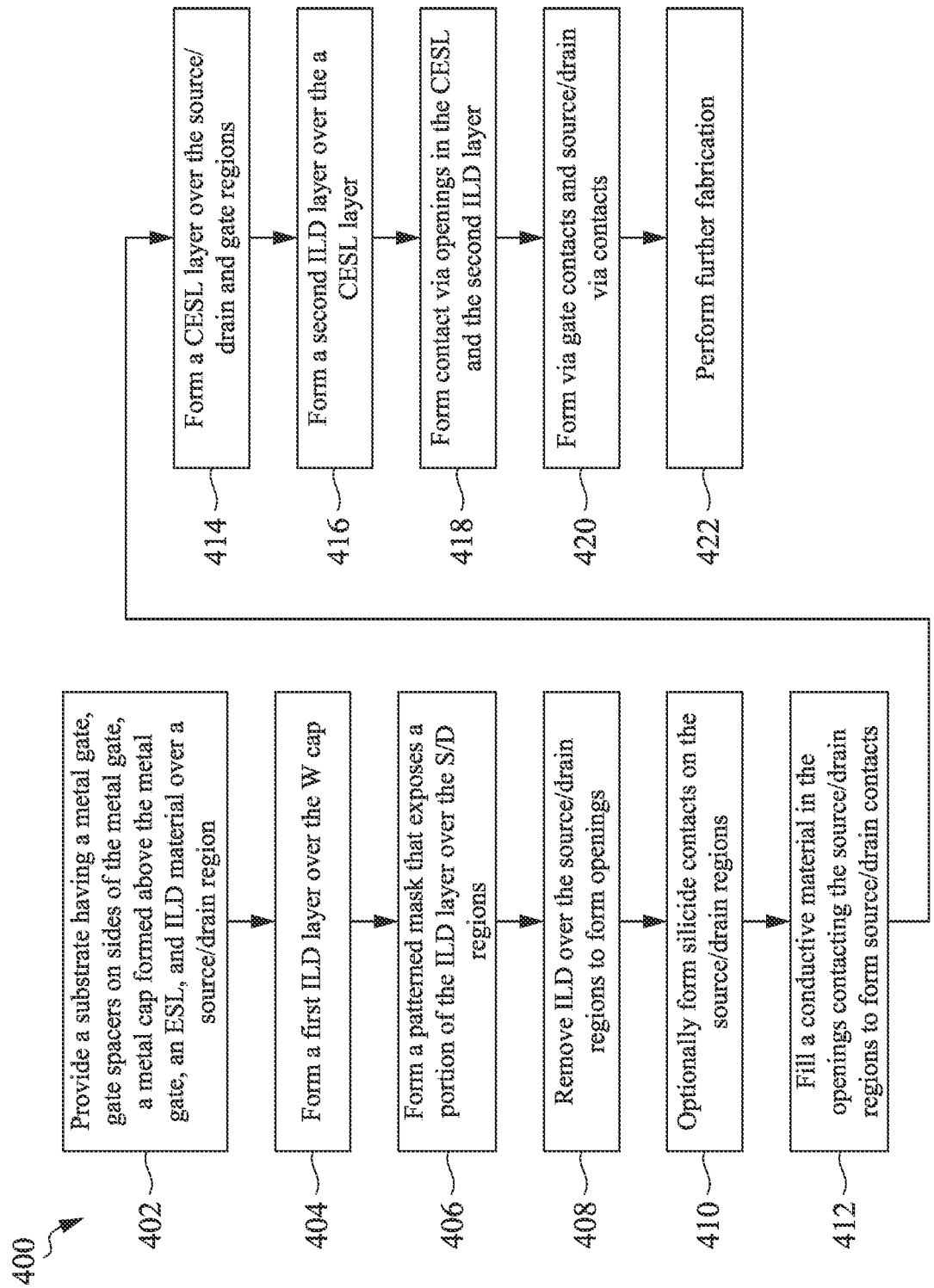
FIG. 4 is a process flow chart depicting an example method of semiconductor fabrication that includes metal drain (MD) fabrication and via gate (VG) fabrication after metal gate formation, in accordance with some embodiments, in accordance with some embodiments.

FIG. 4 is a process flow chart depicting an example method 400 of semiconductor fabrication that includes metal drain (MD) fabrication and via gate (VG) fabrication after metal gate formation, in accordance with some embodiments. The method 400 is merely an example and is not intended to limit the present disclosure beyond what is explicitly recited in the claims. Additional steps may be provided before, during, and after method 400, and some of the steps described can be moved, replaced, or eliminated for additional embodiments of method 400. Additional features may be added in the integrated circuit depicted in the figures, and some of the features described below can be replaced, modified, or eliminated in other embodiments.

FIG. 4 is described in conjunction with FIGS. 5A-5E, wherein FIGS. 5A-5E are diagrams depicting expanded views of an example area 500 at various stages of semiconductor fabricating including metal drain fabrication and via gate fabrication, in accordance with some embodiments. In some figures, some reference numbers of components or features illustrated therein may be omitted to avoid obscuring other components or features; this is for case of depicting the figures.

At block 402, the example method 400 includes providing a substrate having a metal gate, gate spacers on sides of the metal gate, a metal cap formed above the metal gate, an etch stop layer (ESL), and interlayer dielectric (ILD) material over a source/drain region.

At block 404, the example method 400 includes forming a first ILD layer over the metal cap. The first ILD layer may include or be a material such as silicon nitride (SiN), although other suitable materials, such as silicon oxide (SiO2), aluminum oxide (AlO), silicon oxycarbide (SiOC), silicon carbon (SiC), zirconium nitride (ZrN), zirconium oxide (ZrO), combinations of these, or the like, may also be utilized. The first ILD layer may be deposited using a deposition process such as plasma enhanced atomic layer deposition (PEALD), thermal atomic layer deposition (thermal ALD), plasma enhanced chemical vapor deposition (PECVD), or others. Any suitable deposition process and process conditions may be utilized.

At block 406, the example method 400 includes forming a patterned mask that exposes a portion of the ILD material over the source/drain regions. The patterned mask may include a photo resist layer. The patterned mask may be formed by photoresist coating (e.g., spin-on coating), soft baking, mask aligning, exposure, post-exposure baking, developing the photoresist, rinsing, drying (e.g., hard baking), and/or combinations thereof. In some other embodiments, various imaging enhancement layers may be formed under photo resist layer to enhance the pattern transfer. The imaging enhancement layer may comprise a tri-layer including a bottom organic layer, a middle inorganic layer and a top organic layer. The imaging enhancement layer may also include an anti-reflective coating (ARC) material, a polymer layer, an oxide derived from TEOS (tetraethylorthosilicate), silicon oxide, or a Si-containing anti-reflective coating (ARC) material, such as a 42% Si-containing ARC layer. In yet some other embodiments, the patterned mask layer includes a hard mask layer. The hard mask layer includes an oxide material, silicon nitride, silicon oxynitride, an amorphous carbon material, silicon carbide or tetraethylorthosilicate (TEOS).

Figure 5A:
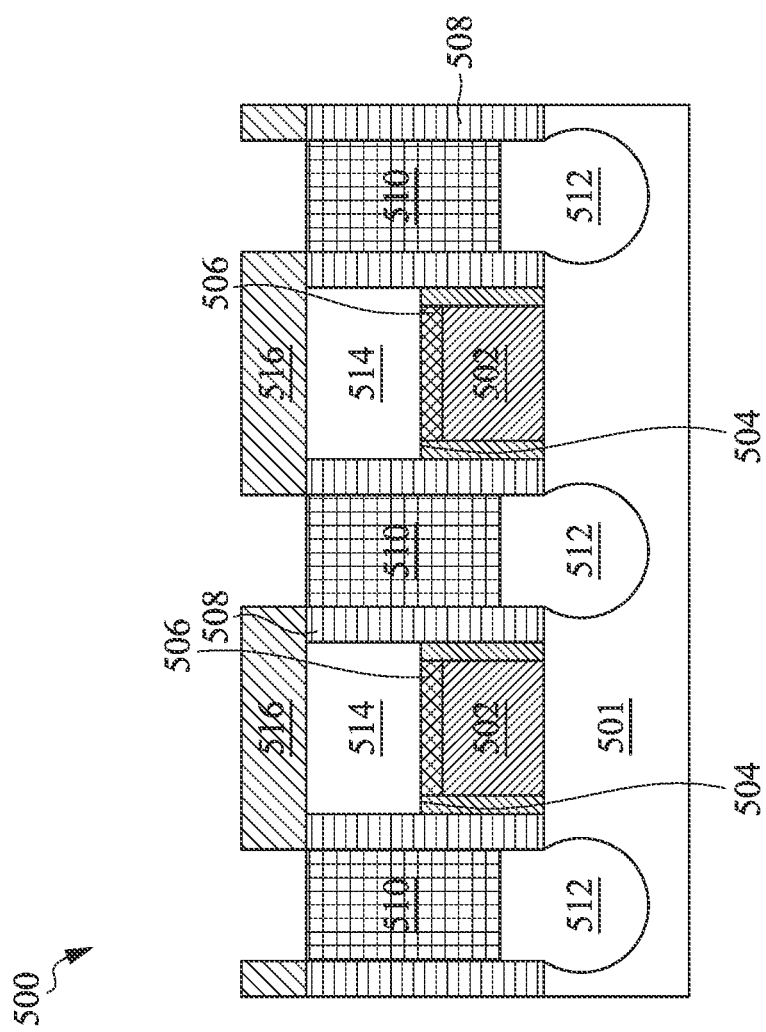
FIGS. 5A-5E are diagrams depicting expanded views of an example area at various stages of semiconductor fabricating including metal drain fabrication and via gate fabrication, in accordance with some embodiments.

Referring to the example of FIG. 5A, in an embodiment after completion of blocks 402, 404, and 406, an area 500 including a substrate 501 having a metal gate stack 502, gate spacers 504 on sides of the metal gate stack 502, a metal cap 506 formed above the metal gate stack 502, an etch stop layer (ESL) 508, ILD material 510 over a source/drain region 512, a first ILD layer 514 over the metal cap 506 and a patterned mask 516 that exposes a portion of the ILD material 510 over the source/drain regions 512 is illustrated.

At block 408, the example method 400 includes removing ILD material over the source/drain regions to form openings that expose the underlying source/drain regions. The exposed portion of the ILD material can be removed by suitable etching process, such as wet etching, dry etching, or combination thereof.

At block 410, the example method 400 includes optionally forming silicide contacts on the source/drain regions that have been exposed. The optional silicide contact may comprise titanium (e.g., titanium silicide (TiSi)) in order to reduce the Schottky barrier height of the contact. However, other metals, such as nickel, cobalt, erbium, platinum, palladium, and the like, may also be used. A silicidation may be performed by blanket deposition of an appropriate metal layer, followed by an annealing step which causes the metal to react with the underlying exposed silicon of the source/drain regions.

Figure 5B:
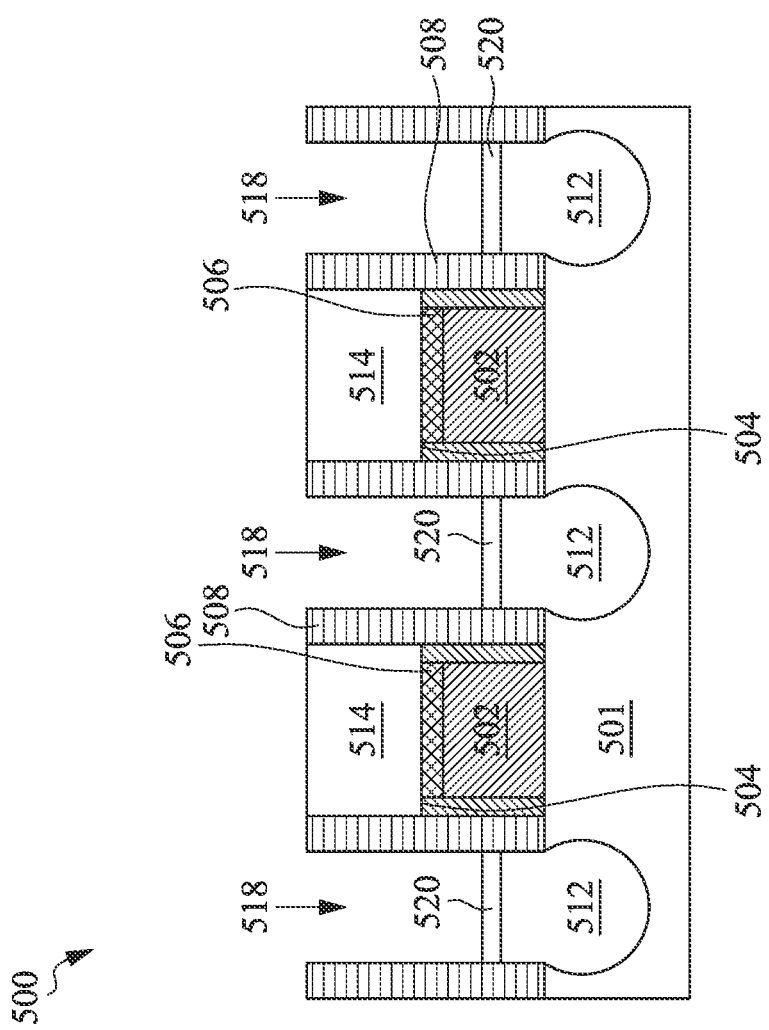

Referring to the example of FIG. 5B, in an embodiment after completion of blocks 408 and 410, the area 500 includes openings 518 that expose underlying source/drain regions 512 and optionally formed silicide contacts 520 on the source/drain regions 512 that have been exposed. The figure depicts that the ILD material 510 over the source/drain regions 512 has been removed to form the openings 518 that expose underlying source/drain regions 512.

At block 412, the example method 400 includes filling a conductive material in the openings contacting the source/drain regions to form source/drain contacts. The source/drain contact may comprise one or more layers. For example, in some embodiments, the source/drain contact comprise a liner and a metal fill material (not individually shown) deposited by, for example, CVD, ALD, electroless deposition (ELD), PVD, electroplating, or another deposition technique. The liner, such as a diffusion barrier layer, an adhesion layer, or the like, may include titanium, titanium nitride, tantalum, tantalum nitride, or the like. The conductive material may be copper, a copper alloy, silver, gold, tungsten, cobalt, aluminum, ruthenium, nickel, or the like. A planarization process, such as a CMP, may be performed to remove excess liner and conductive material. The remaining liner and conductive material form the source/drain contact in the opening.

Figure 5C:
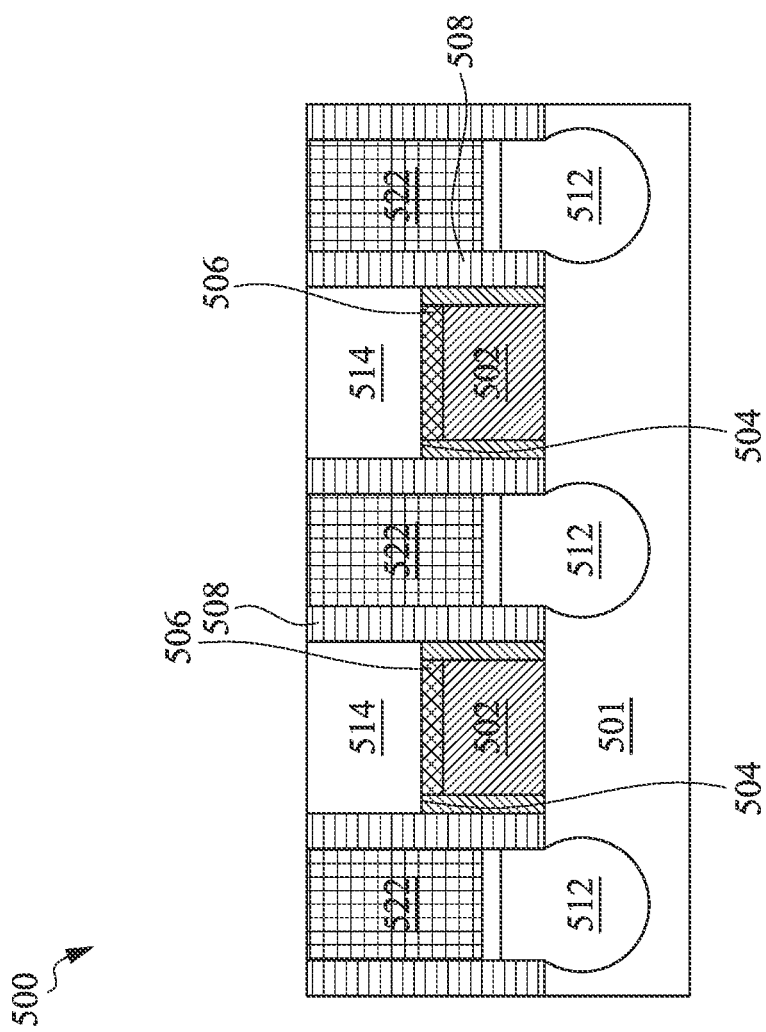

Referring to the example of FIG. 5C, in an embodiment after completion of block 412, the area 500 includes a conductive material filling the openings 518 and contacting the source/drain regions 512 to form source/drain contacts 522.

At block 414, the example method 400 includes forming a contact etch stop layer (CESL) layer over the source/drain and gate regions. The CESL may be deposited using one or more low temperature deposition processes such as chemical vapor deposition, physical vapor deposition, or atomic layer deposition.

At block 416, the example method 400 includes forming a second ILD layer over the CESL layer. The second ILD layer may be formed of a dielectric material such as oxides (e.g., silicon oxide (SiO2)) and may be deposited over the CESL by any acceptable process (e.g., CVD, PEALD, thermal ALD, PECVD, or the like). The second ILD layer may also be formed of other suitable insulation materials (e.g., PSG, BSG, BPSG, USG, or the like) deposited by any suitable method (e.g., CVD, PECVD, flowable CVD, or the like). After formation, the second ILD layer may be cured, such as by an ultraviolet curing process.

Figure 5D:
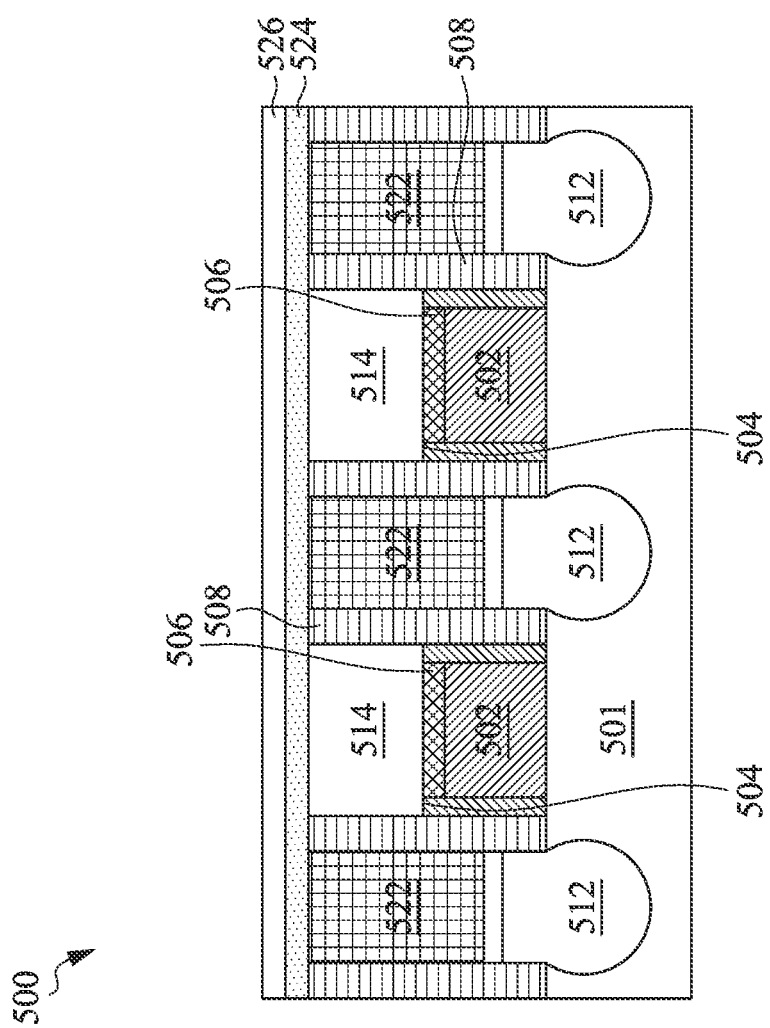

Referring to the example of FIG. 5D, in an embodiment after completion of blocks 414 and 416, the area 500 includes a CESL layer 524 formed over the source/drain and gate regions and a second ILD layer 526 formed over the CESL layer 524.

At block 418, the example method 400 includes forming contact via openings in the CESL and the second ILD layer for gate via contacts and for source/drain via contacts. Contact via openings for the gate via contact and the source/drain via contact are formed through using one or more etching processes. According to some embodiments, openings for the gate via contact are formed through the second ILD layer, the CESL, and the first ILD layer and openings for the source/drain via contact are formed through the second ILD layer and the CESL. The openings may be formed using any combination of acceptable photolithography and suitable etching techniques such as dry etching process (e.g., plasma etch, reactive ion etch (RIE), physical etching (e.g., ion beam etch (IBE))), wet etching, combinations thereof, and the like. However, any suitable etching processes may be utilized to form the contact via openings.

At block 420, the example method 400 includes forming via gate contacts and source/drain via contacts. The gate via contact is formed over and electrically coupled to the metal cap and the source/drain via contact is formed over and electrically coupled to source/drain contacts. The via gate contacts and/or the source/drain via contacts can be formed by depositing metal material in the opening. The metal material may be deposited by CVD, ALD, electroless deposition (ELD), PVD, electroplating, or another deposition technique. The via gate contacts and/or the source/drain via contacts may be or comprise tungsten, cobalt, copper, ruthenium, aluminum, gold, silver, alloys thereof, the like, or a combination thereof.

Figure 5E:
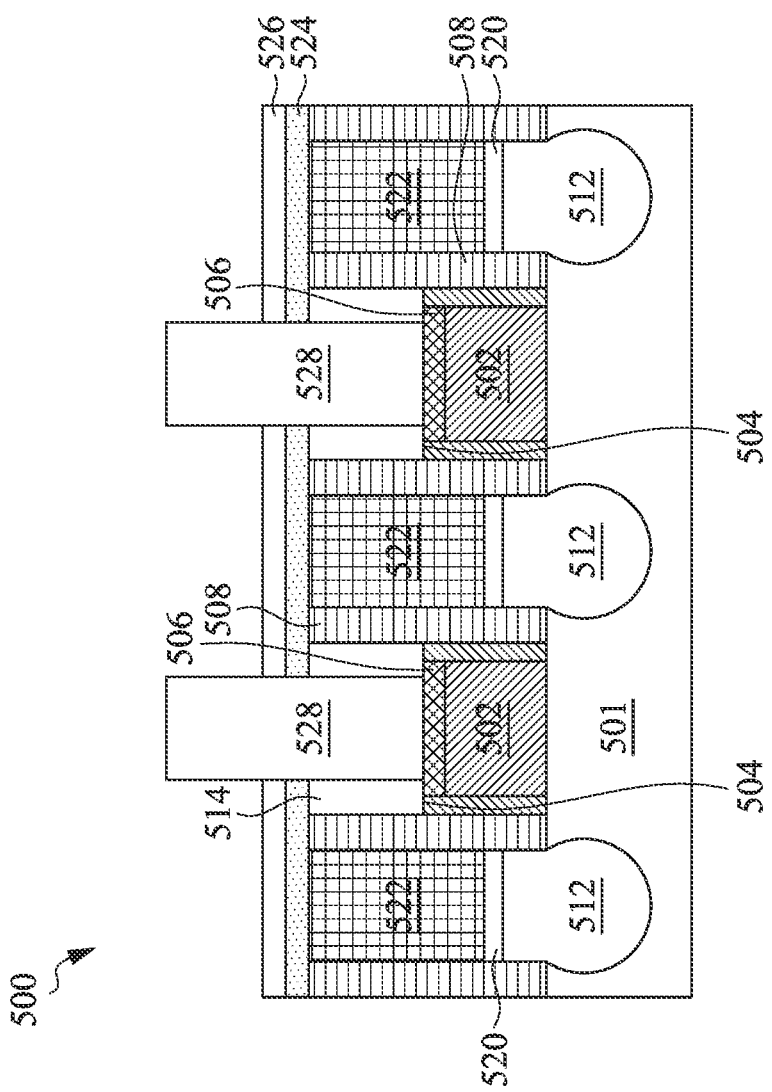

Referring to the example of FIG. 5E, in an embodiment after completion of blocks 418 and 420, the area 500 includes via gate contacts 528 and source/drain via contacts (not shown).

At block 422, the example method 400 includes performing further fabrication operations. A semiconductor device may undergo further processing to form various features and regions known in the art. For example, subsequent processing may form various contacts/vias/lines and multilayer interconnect features (e.g., metal layers and interlayer dielectrics) on the substrate, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 400, and some process steps described above may be replaced or eliminated in accordance with various embodiments of the method 400.

Figure 6:
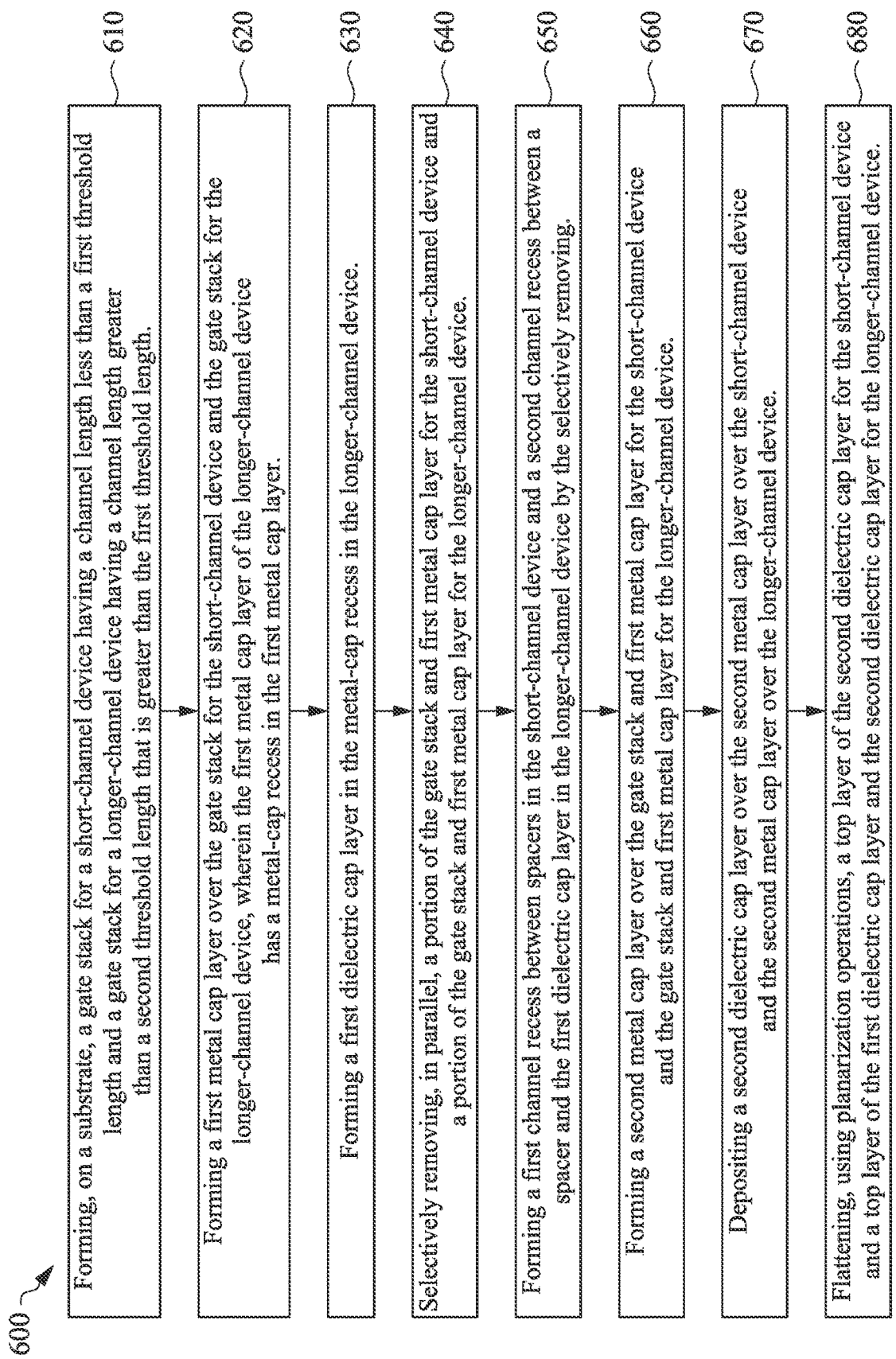
FIG. 6 is a process flow chart depicting an example method of semiconductor fabrication, in accordance with some embodiments.

FIG. 6 is a process flow chart depicting an example method 600 of semiconductor fabrication, in accordance with some embodiments. The method 600 is merely an example and is not intended to limit the present disclosure beyond what is explicitly recited in the claims. Additional steps may be provided before, during, and after method 600, and some of the steps described can be moved, replaced, or eliminated for additional embodiments of method 600. Additional features may be added in the integrated circuit depicted in the figures, and some of the features described below can be replaced, modified, or eliminated in other embodiments.

At block 610, the example method 600 includes forming, on a substrate, a gate stack for a short-channel device having a channel length less than a first threshold length and a gate stack for a longer-channel device having a channel length greater than a second threshold length that is greater than the first threshold length. In various embodiments, the short-channel device has a channel length of approximately 25 nanometers (nm) or less and the longer-channel device has a channel length of approximately 30 nm or more.

At block 620, the example method 600 includes forming a first metal cap layer over the gate stack for the short-channel device and the gate stack for the longer-channel device, wherein the first metal cap layer of the longer-channel device has a metal-cap recess in the first metal cap layer.

At block 630, the example method 600 includes forming a first dielectric cap layer in the metal-cap recess in the longer-channel device.

At step 640, the example method 600 includes selectively removing, in parallel, a portion of the gate stack and first metal cap layer for the short-channel device and a portion of the gate stack and first metal cap layer for the longer-channel device.

At block 650, the example method 600 includes forming a first channel recess between spacers in the short-channel device and a second channel recess between a spacer and the first dielectric cap layer in the longer-channel device by the selectively removing. In various embodiments, each of the first channel recess and the second channel recess has a gap dimension from a top of the recess to a bottom of the recess. In various embodiments, a ratio of a difference between the gap dimensions of the first channel recess and second channel recess is within a range of approximately 0.73 to approximately 1.71. In various embodiments, a difference between the gap dimensions of the first channel recess and second channel recess is within plus or minus approximately 2 nm to approximately 5 nm. In various embodiments, each of the first channel recess and the second channel recess has a width dimension and a difference between the width dimensions of the first channel recess and second channel recess is less than 3 nm.

At block 660, the example method 600 includes forming a second metal cap layer over the gate stack and first metal cap layer for the short-channel device and the gate stack and first metal cap layer for the longer-channel device.

At block 670, the example method 600 includes depositing a second dielectric cap layer over the second metal cap layer over the short-channel device and the second metal cap layer over the longer-channel device.

At block 680, the example method 600 includes flattening, using planarization operations, a top layer of the second dielectric cap layer for the short-channel device and a top layer of the first dielectric cap layer and the second dielectric cap layer for the longer channel device.

Although the foregoing examples were illustrated with respect to FinFET devices, the foregoing apparatus, devices, and methods may also be used in connection with other semiconductor transistor technologies such as gate all around (GAA) and planar transistor technologies.

In some aspects, the techniques described herein relate to a fabrication method, including: forming, on a substrate, a gate stack for a short-channel device having a first channel length and a gate stack for a longer-channel device having a second channel length that is greater than the first channel length; forming a first metal cap layer over the gate stack for the short-channel device and the gate stack for the longer-channel device, wherein the first metal cap layer of the longer-channel device has a metal-cap recess in the first metal cap layer; forming a first dielectric cap layer in the metal-cap recess in the longer-channel device; selectively removing, in parallel, a portion of the gate stack and first metal cap layer for the short-channel device and a portion of the gate stack and first metal cap layer for the longer-channel device; forming a first channel recess between spacers in the short-channel device and a second channel recess between a spacer and the first dielectric cap layer in the longer-channel device by the selectively removing; wherein each of the first channel recess and the second channel recess has a gap dimension from a top of the recess to a bottom of the recess and wherein a ratio of a difference between the gap dimensions of the first channel recess and second channel recess is within a range of approximately 0.73 to approximately 1.71; forming a second metal cap layer over the gate stack and first metal cap layer for the short-channel device and the gate stack and first metal cap layer for the longer-channel device; depositing a second dielectric cap layer over the second metal cap layer over the short-channel device and the second metal cap layer over the longer-channel device; and flattening, using planarization operations, a top layer of the second dielectric cap layer for the short-channel device and a top layer of the first dielectric cap layer and the second dielectric cap layer for the longer channel device.

In some aspects, the techniques described herein relate to a fabrication method, wherein the first channel length is approximately 25 nanometers (nm) or less, and the second channel length is approximately 30 nm to approximately 60 nm.

In some aspects, the techniques described herein relate to a fabrication method, wherein the first channel length is approximately 25 nanometers (nm) or less, and the second channel length is approximately 80 nm to approximately 200 nm.

In some aspects, the techniques described herein relate to a fabrication method, wherein a difference between the gap dimensions of the first channel recess and second channel recess is within plus or minus approximately 2 nm to approximately 5 nm.

In some aspects, the techniques described herein relate to a fabrication method, wherein each of the first channel recess and the second channel recess has a width dimension and a difference between the width dimensions of the first channel recess and second channel recess is less than 3 nm;

In some aspects, the techniques described herein relate to a fabrication method, wherein the width dimension of the first channel recess is approximately 10 nm to approximately 15 nm and the width dimension of the second channel recess is approximately 7 nm to approximately 18 nm.

In some aspects, the techniques described herein relate to a fabrication method, wherein the first dielectric cap layer has a width of approximately 15 nm to approximately 30 nm.

In some aspects, the techniques described herein relate to a fabrication method, wherein the first dielectric cap layer has a width of approximately 40 nm to approximately 180 nm.

In some aspects, the techniques described herein relate to a fabrication method, wherein the gap dimension of the first channel recess is approximately 30 nm to approximately 70 nm and the gap dimension of the second channel recess is approximately 25 nm to approximately 75 nm.

In some aspects, the techniques described herein relate to a fabrication method, including: forming, on a substrate, a gate stack for a short-channel device having a channel length less than a first threshold length and a gate stack for a longer-channel device having a channel length greater than a second threshold length that is greater than the first threshold length; forming a first metal cap layer over the gate stack for the short-channel device and the gate stack for the longer-channel device, wherein the first metal cap layer of the longer-channel device has a metal-cap recess in the first metal cap layer; forming a first dielectric cap layer in the metal-cap recess in the longer-channel device; selectively removing, by performing dry etching operations in parallel in a plasma etch chamber, a portion of the gate stack and first metal cap layer for the short-channel device and a portion of the gate stack and first metal cap layer for the longer-channel device; forming a first channel recess between spacers in the short-channel device and a second channel recess between a spacer and the first dielectric cap layer in the longer-channel device by the selectively removing; wherein each of the first channel recess and the second channel recess has a width dimension and a difference between the width dimensions of the first channel recess and second channel recess is less than 3 nm; forming a second metal cap layer over the gate stack and first metal cap layer for the short-channel device and the gate stack and first metal cap layer for the longer-channel device; depositing a second dielectric cap layer over the second metal cap layer over the short-channel device and the second metal cap layer over the longer-channel device; and flattening, using planarization operations, a top layer of the second dielectric cap layer for the short-channel device and a top layer of the first dielectric cap layer and the second dielectric cap layer for the longer channel device.

In some aspects, the techniques described herein relate to a method, wherein performing dry etching operations includes performing dry etching operations using an etch gas including Boron trichloride ($BCl_3$), Chlorine ($Cl_2$), Argon (Ar), and Oxygen ($O_2$).

In some aspects, the techniques described herein relate to a method, wherein performing dry etching operations includes performing dry etching operations by administering the $BCl_3$ between about 0 sccm (standard cubic centimeters per minute) to about 1000 sccm, the $Cl_2$ between about 0 sccm to about 1000 sccm, the Ar between about 0 sccm to about 500 sccm, and the $O_2$ between about 0 sccm to about 100 sccm.

In some aspects, the techniques described herein relate to a method wherein performing dry etching operations includes performing dry etching operations by administering the etch gas with a chamber pressure from about 1.5 mTorr to about 300 mTorr, at a source power from about 300 W to about 1000 W, and at a bias power from about 0 W to about 100 W.

In some aspects, the techniques described herein relate to a semiconductor device including: a short-channel device having a gate stack and a channel length less than a first threshold length; a longer-channel device having a gate stack and channel length greater than a second threshold length that is greater than the first threshold length; a first metal cap layer over the gate stack for the short-channel device and the gate stack for the longer-channel device, wherein the first metal cap layer of the longer-channel device has a metal-cap recess in the first metal cap layer; a first dielectric cap layer in the metal-cap recess in the longer-channel device; a first channel recess between spacers in the short-channel device, and a second channel recess between a spacer and the first dielectric cap layer in the longer-channel device; wherein each of the first channel recess and the second channel recess has a width dimension and a difference between the width dimensions of the first channel recess and the second channel recess is less than 3 nanometers (nm); a second metal cap layer over the gate stack and first metal cap layer for the short-channel device and the gate stack and first metal cap layer for the longer-channel device; and a second dielectric cap layer over the second metal cap layer in the first channel recess of the short-channel device and the second metal cap layer in the second channel recess of the longer-channel device.

In some aspects, the techniques described herein relate to a semiconductor device, wherein the short-channel device has a channel length of approximately 25 nm or less and the longer-channel device includes a mid-channel device having a channel length of approximately 30 nm to approximately 60 nm.

In some aspects, the techniques described herein relate to a semiconductor device, wherein the short-channel device has a channel length of approximately 25 nm or less and the longer-channel device includes a long-channel device having a channel length of approximately 80 nm to approximately 200 nm.

In some aspects, the techniques described herein relate to a semiconductor device, wherein the width dimension of the first channel recess is approximately 10 nm to approximately 15 nm and the width dimension of the second channel recess is approximately 7 nm to approximately 18 nm.

In some aspects, the techniques described herein relate to a semiconductor device, wherein the first dielectric cap layer has a width of approximately 15 nm to approximately 30 nm.

In some aspects, the techniques described herein relate to a semiconductor device, wherein the first dielectric cap layer has a width of approximately 40 nm to approximately 180 nm.

In some aspects, the techniques described herein relate to a semiconductor device, wherein a bottom edge of first dielectric cap layer extends below portions of the first metal cap layer.

In some aspects, the techniques described herein relate to a fabrication method, including: forming, on a substrate, a gate stack for a short-channel device having a channel length of approximately 15 nm to approximately 25 nm, a mid-channel device having a channel length of approximately 30 nm to approximately 60 nm, and a long-channel device having a channel length of approximately 80 nm to approximately 200 nm; forming a first metal cap layer over the gate stack for the short-channel device, the gate stack for the mid-channel device, and the gate stack for the long-channel device, wherein the first metal cap layer of the mid-channel device has a first recess in the metal cap layer and the first metal cap layer of the long-channel device has a second recess in the metal cap layer; forming a first dielectric cap layer in the first recess in the mid-channel device and a second dielectric cap layer in the second recess in the long-channel device; selectively removing, in parallel, a portion of the gate stack and first metal cap layer for the short-channel device, a portion of the gate stack and first metal cap layer for the mid-channel device, and a portion of the gate stack and first metal cap layer for the long-channel device (in a plasma etch chamber) thereby forming a first channel recess between spacers in the short-channel device, a second channel recess between a spacer and the first dielectric cap layer in the mid-channel device, and a third channel recess between a spacer and the second dielectric cap layer in the long-channel device; wherein each of the first channel recess, the second channel recess, and the third channel recess has a width dimension and a gap dimension from a top of the recess to a bottom of the recess; wherein a difference between the width dimensions of the first channel recess and second channel recess is less than 3 nm, and a difference between the width dimensions of the first channel recess and third channel recess is less than 3 nm; wherein a difference between the gap dimensions of the first channel recess and second channel recess is within plus or minus approximately 2 nm to approximately 5 nm, and a difference between the gap dimensions of the first channel recess and third channel recess is within plus or minus approximately 2 nm to approximately 5 nm; forming a second metal cap layer over the gate stack and first metal cap layer for the short-channel device, the gate stack and first metal cap layer for the mid-channel device, and the gate stack and first metal cap layer for the long-channel device; depositing a second dielectric cap layer over the second metal cap layer over the short-channel device, the second metal cap layer over the mid-channel device, and the second metal cap layer over the long-channel device; and flattening, using planarization operations, a top layer of the second dielectric cap layer for the short-channel device, a top layer of the first dielectric cap layer and the second dielectric cap layer for the mid-channel device, and a top layer of the first dielectric cap layer and the second dielectric cap layer for the long channel device.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A fabrication method, comprising:
forming, on a substrate, a gate stack for a short-channel device having a first channel length and a gate stack for a longer-channel device having a second channel length that is greater than the first channel length;
forming a first metal cap layer over the gate stack for the short-channel device and the gate stack for the longer-channel device, wherein the first metal cap layer of the longer-channel device has a metal-cap recess in the first metal cap layer;
forming a first dielectric cap layer in the metal-cap recess in the longer-channel device;
selectively removing, in parallel, a portion of the gate stack and first metal cap layer for the short-channel device and a portion of the gate stack and first metal cap layer for the longer-channel device;
forming a first channel recess between spacers in the short-channel device and a second channel recess between a spacer and the first dielectric cap layer in the longer-channel device by the selectively removing;
wherein each of the first channel recess and the second channel recess has a gap dimension from a top of the recess to a bottom of the recess and wherein a ratio of a difference between the gap dimensions of the first channel recess and second channel recess is within a range of approximately 0.4 to approximately 2.8;
forming a second metal cap layer over the gate stack and first metal cap layer for the short-channel device and the gate stack and first metal cap layer for the longer-channel device;
depositing a second dielectric cap layer over the second metal cap layer over the short-channel device and the second metal cap layer over the longer-channel device; and
flattening, using planarization operations, a top layer of the second dielectric cap layer for the short-channel device and a top layer of the first dielectric cap layer and the second dielectric cap layer for the longer-channel device.

2. The fabrication method of claim 1, wherein the first channel length is approximately 25 nanometers (nm) or less, and the second channel length is approximately 30 nm to approximately 60 nm.

3. The fabrication method of claim 1, wherein the first channel length is approximately 25 nanometers (nm) or less, and the second channel length is approximately 80 nm to approximately 200 nm.

4. The fabrication method of claim 1, wherein a difference between the gap dimensions of the first channel recess and second channel recess is within plus or minus approximately 2 nm to approximately 5 nm.

5. The fabrication method of claim 1, wherein each of the first channel recess and the second channel recess has a width dimension and a difference between the width dimensions of the first channel recess and second channel recess is less than 3 nm.

6. The fabrication method of claim 5, wherein the width dimension of the first channel recess is approximately 10 nm to approximately 15 nm and the width dimension of the second channel recess is approximately 7 nm to approximately 18 nm.

7. The fabrication method of claim 6, wherein the first dielectric cap layer has a width of approximately 15 nm to approximately 30 nm.

8. The fabrication method of claim 6, wherein the first dielectric cap layer has a width of approximately 40 nm to approximately 180 nm.

9. The fabrication method of claim 1, wherein the gap dimension of the first channel recess is approximately 30 nm to approximately 70 nm and the gap dimension of the second channel recess is approximately 25 nm to approximately 75 nm.

10. A method, comprising:
forming, on a substrate, a gate stack for a short-channel device having a channel length less than a first threshold length and a gate stack for a longer-channel device having a channel length greater than a second threshold length that is greater than the first threshold length;
forming a first metal cap layer over the gate stack for the short-channel device and the gate stack for the longer-channel device, wherein the first metal cap layer of the longer-channel device has a metal-cap recess in the first metal cap layer;
forming a first dielectric cap layer in the metal-cap recess in the longer-channel device;
selectively removing, by performing dry etching operations in parallel in a plasma etch chamber, a portion of the gate stack and first metal cap layer for the short-channel device and a portion of the gate stack and first metal cap layer for the longer-channel device;
forming a first channel recess between spacers in the short-channel device and a second channel recess between a spacer and the first dielectric cap layer in the longer-channel device by the selectively removing;
wherein each of the first channel recess and the second channel recess has a width dimension and a difference between the width dimensions of the first channel recess and second channel recess is less than 3 nm;
forming a second metal cap layer over the gate stack and first metal cap layer for the short-channel device and the gate stack and first metal cap layer for the longer-channel device;
depositing a second dielectric cap layer over the second metal cap layer over the short-channel device and the second metal cap layer over the longer-channel device; and flattening, using planarization operations, a top layer of the second dielectric cap layer for the short-channel device and a top layer of the first dielectric cap layer and the second dielectric cap layer for the longer-channel device.

11. The method of claim 10, wherein performing dry etching operations comprises performing dry etching operations using an etch gas comprising Boron trichloride ($BCl_3$), Chlorine ($Cl_2$), Argon (Ar), and Oxygen ($O_2$).

12. The method of claim 11, wherein performing dry etching operations comprises performing dry etching operations by administering the $BCl_3$ between about 0 sccm (standard cubic centimeters per minute) to about 1000 sccm, the $Cl_2$ between about 0 sccm to about 1000 sccm, the Ar between about 0 sccm to about 500 sccm, and the $O_2$ between about 0 sccm to about 100 sccm.

13. The method of claim 12 wherein performing dry etching operations comprises performing dry etching operations by administering the etch gas with a chamber pressure from about 1.5 mTorr to about 300 mTorr, at a source power from about 300 W to about 1000 W, and at a bias power from about 0 W to about 100 W.

14. A method comprising:
providing a short-channel device having a gate stack and a channel length less than a first threshold length;
providing a longer-channel device having a gate stack and channel length greater than a second threshold length that is greater than the first threshold length;
depositing a first metal cap layer over the gate stack for the short-channel device and the gate stack for the longer-channel device, wherein the first metal cap layer of the longer-channel device has a metal-cap recess in the first metal cap layer;
depositing a first dielectric cap layer in the metal-cap recess in the longer-channel device;
providing a first channel recess between spacers in the short-channel device, and a second channel recess between a spacer and the first dielectric cap layer in the longer-channel device;
wherein each of the first channel recess and the second channel recess has a width dimension and a difference between the width dimensions of the first channel recess and the second channel recess is less than 3 nanometers (nm);
a second metal cap layer over the gate stack and first metal cap layer for the short-channel device and the gate stack and first metal cap layer for the longer-channel device; and
a second dielectric cap layer over the second metal cap layer in the first channel recess of the short-channel device and the second metal cap layer in the second channel recess of the longer-channel device.

15. The method of claim 14, wherein the short-channel device has a channel length of approximately 25 nm or less and the longer-channel device comprises a mid-channel device having a channel length of approximately 30 nm to approximately 60 nm.

16. The method of claim 14, wherein the short-channel device has a channel length of approximately 25 nm or less and the longer-channel device comprises a long-channel device having a channel length of approximately 80 nm to approximately 200 nm.

17. The method of claim 14, wherein the width dimension of the first channel recess is approximately 10 nm to approximately 15 nm and the width dimension of the second channel recess is approximately 7 nm to approximately 18 nm.

18. The method of claim 17, wherein the first dielectric cap layer has a width of approximately 15 nm to approximately 30 nm.

19. The method of claim 17, wherein the first dielectric cap layer has a width of approximately 40 nm to approximately 180 nm.

20. The method of claim 14, wherein a bottom edge of first dielectric cap layer extends below portions of the first metal cap layer.

* * * * *